US009223307B1

(12) United States Patent
Wu et al.

(10) Patent No.: US 9,223,307 B1
(45) Date of Patent: Dec. 29, 2015

(54) METHOD FOR SCHEDULING SINGLE-ARM CLUSTER TOOLS WITH WAFER REVISITING AND RESIDENCY TIME CONSTRAINTS

(71) Applicant: Macau University of Science and Technology, Macau (MO)

(72) Inventors: Naiqi Wu, Macau (MO); Fajun Yang, Macau (MO); Yan Qiao, Macau (MO); MengChu Zhou, Newark, NJ (US)

(73) Assignee: Macau University of Science and Technology, Macau (MO)

( * ) Notice: Subject to any disclaimer, the term of this patent is extended or adjusted under 35 U.S.C. 154(b) by 0 days.

(21) Appl. No.: 14/639,980

(22) Filed: Mar. 5, 2015

Related U.S. Application Data

(60) Provisional application No. 62/102,112, filed on Jan. 12, 2015.

(51) Int. Cl.
*G06F 19/00* (2011.01)
*G05B 19/418* (2006.01)
*B25J 9/00* (2006.01)
*G06F 17/50* (2006.01)

(52) U.S. Cl.
CPC ............ *G05B 19/41865* (2013.01); *B25J 9/009* (2013.01); *G06F 17/5013* (2013.01)

(58) Field of Classification Search
CPC ............ H01L 21/67276; H01L 21/677; H01L 21/67703; H01L 21/67739; H01L 21/67745; G05B 19/00; G05B 19/18; G05B 19/41895; G05B 2219/31271; G06Q 10/06; G06Q 10/0631; G06Q 10/08
See application file for complete search history.

(56) References Cited

U.S. PATENT DOCUMENTS

| 6,738,681 | B2* | 5/2004 | Kobayashi | ....... G05B 19/41895 |
| | | | | 700/100 |
| 8,160,736 | B2* | 4/2012 | Krisnamuthi | .......... G06Q 10/06 |
| | | | | 700/112 |
| 2005/0137734 | A1* | 6/2005 | Nieuwelaar | ...... G05B 19/41865 |
| | | | | 700/100 |

(Continued)

OTHER PUBLICATIONS

Kim et al., "Schedule Restoration for Single-Armed Cluster Tools", IEEE Transactions on Semiconductor Manufacturing, 2014, vol. 27, Issue: 3, pp. 388-399.*
Wu et al., "Petri Net-Based Scheduling of Single-Arm Cluster Tools With Reentrant Atomic Layer Deposition Processes", IEEE Transactions on Automation Science and Engineering, 2011, vol. 8, Issue: 1, pp. 42-55.*

(Continued)

*Primary Examiner* — Crystal J Barnes-Bullock
(74) *Attorney, Agent, or Firm* — Ella Cheong Hong Kong; Sam T. Yip

(57) ABSTRACT

In semiconductor manufacturing, there are wafer fabrication processes in cluster tools that need a wafer to visit some processing steps for more than once, leading to a revisiting process. Also, wafers may be subject to wafer residency time constraints. By considering atomic layer deposition (ALD) as a typical wafer revisiting process, this invention studies the challenging scheduling problem of single-arm cluster tools for the ALD process with wafer residency time constraints. By recognizing that the key to this problem is to schedule the robot tasks, the present invention presents different robot task sequencing strategies. With these strategies for different cases, the present invention performs the schedulability analysis and derives the schedulability conditions for such tools for the first time. If schedulable, the present invention proposes scheduling algorithms to obtain an optimal schedule efficiently. Illustrative examples are given to show the application of the proposed concepts and approach.

20 Claims, 13 Drawing Sheets

(a)    (b)

(56) References Cited

U.S. PATENT DOCUMENTS

2014/0099176 A1* 4/2014 Nogi ............... G05B 19/00 414/217
2014/0294555 A1* 10/2014 Kawaguchi ....... H01L 21/67745 414/805

OTHER PUBLICATIONS

Yi et al., "Steady-State Throughput and Scheduling Analysis of Multi-Cluster Tools for Semiconductor Manufacturing: A Decomposition Approach", Proceedings of the 2005 IEEE International Conference on Robotics and Automation, 2005, pp. 292-298.*

* cited by examiner

METHOD FOR SCHEDULING SINGLE-ARM CLUSTER TOOLS WITH WAFER REVISITING AND RESIDENCY TIME CONSTRAINTS

CLAIM FOR DOMESTIC PRIORITY

This application claims priority under 35 U.S.C. §119 to the U.S. Provisional Patent Application No. 62/102,112 filed Jan. 12, 2015, the disclosure of which is incorporated herein by reference in its entirety.

COPYRIGHT NOTICE

A portion of the disclosure of this patent document contains material, which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to a method for scheduling single-arm cluster tools. More particularly, the present invention relates to a method for scheduling single-arm cluster tools with wafer revisiting and residency time constraints.

BACKGROUND

The following references are cited in the specification. Disclosures of these references are incorporated herein by reference in their entirety.
List of References:
N. Brauner, "Identical part production in cyclic robotic cells: Concepts, overview and open questions," Discrete Appl. Math., vol. 156, no. 13, pp. 2480-2492, 2008.
W. K. Chan, J. G. Yi, and S. W. Ding, "Optimal Scheduling of Multi-cluster Tools with Constant Robot Moving Times, Part I: Two-Cluster Analysis," *IEEE Transactions on Automation Science and Engineering*, vol. 8, no. 1, pp. 5-16, 2011a.
W. K. Chan, J. G. Yi, S. W. Ding, and D. Z. Song, "Optimal Scheduling of Multi-cluster Tools with Constant Robot Moving Times, Part II: Tree-Like Topology Configurations," *IEEE Transactions on Automation Science and Engineering*, vol. 8, no. 1, pp. 17-28, 2011b.
Y. Crama, V. Kats, J. van de Klundert, and E. Levner, "Cyclic scheduling in robotic flowshops," Ann. Oper. Res.: Math. Ind. Syst., vol. 96, no. 1-4, pp. 97-124, 2000.
Y. Crama and J. van de Klundert, "Cyclic scheduling of identical parts in a robotic cell," Oper. Res., vol. 45, no. 6, pp. 952-965, 1997.
M. Dawande, N. Geismar, M. Pinedo, and C. Sriskandarajah, "Throughput optimization in dual-gripper interval robotic cells," IIE Trans., vol. 42, no. 1, pp. 1-15, January 2010.
M. Dawande, H. N. Geismar, S. P. Sethi, and C. Sriskandarajah, Throughput Optimization in Robotic Cells. New York: Springer, 2007.
M. Dawande, C. Sriskandarajah, and C. S. Sethi, "On throughput maximization in constant travel-time robotic cells," Manuf. Serv. Oper. Manage., vol. 4, no. 4, pp. 296-312, 2002.
H. N. Geismar, L. M. A. Chan, M. Dawande, and C. Sriskandarajah, "Approximations to optimal k-unit cycles for single- and dual-gripper robotic cells," Prod. Oper. Manage
H. N. Geismar, L. M. A. Chan, M. Dawande, and C. Sriskandarajah, "Approximations to optimal k-unit cycles for single- and dual-gripper robotic cells," Prod. Oper. Manage., vol. 17, no. 5, pp. 551-563, 2008.
H. N. Geismar, M. Dawande, and C. Sriskandarajah, "Throughput optimization in constant travel-time dual-gripper robotic cells with parallel machines," Prod. Oper. Manage., vol. 15, no. 2, pp. 311-328, 2006.
J.-H. Kim, T.-E. Lee, H.-Y. Lee, and D.-B. Park, Scheduling analysis of timed-constrained dual-armed cluster tools, *IEEE Transactions on Semiconductor Manufacturing*, vol. 16, no. 3, 521-534, 2003.
T.-E. Lee and S.-H. Park, "An extended event graph with negative places and tokens for timed window constraints," *IEEE Transactions on Automation Science and Engineering*, vol. 2, no. 4, 319-332, 2005.
H.-Y. Lee and T.-E. Lee. Scheduling single-arm cluster tools with reentrant wafer flows. IEEE transactions on Semiconductor Manufacturing, vol.19, no.2, 226-240, 2006.
T.-E. Lee, H.-Y. Lee, and Y.-H. Shin, Workload balancing and scheduling of a single-armed cluster tool, in Proceedings of the 5th APIEMS Conference, Gold Coast, Australia, 1-15, 2004.
M.-J. Lopez and S.-C. Wood, Systems of multiple cluster tools—configuration, reliability, and performance, IEEE Transactions on Semiconductor Manufacturing, vol. 16, no. 2, 170-178, 2003.
M., Pinedo, Scheduling: Theory, Algorithms, and Systems, Prentice Hall, Englewood Cliffs, N.J., 1995.
T. L. Perkinson, R. S. Gyurcsik, and P. K. MacLarty, "Single-wafer cluster tool performance: An analysis of the effects of redundant chambers and revisitations sequences on throughput," *IEEE Transactions on Semiconductor Manufacturing*, vol. 9, no. 3, 384-400, 1996.
T. L. Perkinson, P. K. MacLarty, R. S. Gyurcsik, and R. K. Cavin, III, "Single-wafer cluster tool performance: An analysis of throughput," *IEEE Transactions on Semiconductor Manufacturing*, vol. 7, no. 3, 369-373, 1994.
Y. Qiao, N. Q. Wu, and M. C. Zhou, A Petri net-based novel scheduling approach and its cycle time analysis for dual-arm cluster tools with wafer revisiting, *IEEE Transactions on Semiconductor manufacturing*, vol. 26, no. 1, 100-110, 2013.
Y. Qiao, N. Q. Wu, and M. C. Zhou, Scheduling of dual-arm cluster tools with wafer revisiting and residency time constraints, *IEEE Transactions on Industrial Informatics*, vol. 10, no. 1, 286-300, 2014a.
Y. Qiao, N. Q. Wu, and M. C. Zhou, Schedulability and scheduling analysis of dual-arm cluster tools with wafer revisiting and residency time constraints based on a novel schedule, *IEEE Transactions on Systems, Man, & Cybernetics: Systems*, in press, 2014b.
S. Sechi, J. Sidney, and C. Sriskandarajah, "Scheduling in dual-gripper robotic cells for productivity gains," IEEE Trans. Robot. Autom., vol.17, no. 3, pp. 324-341, 2001.
S. Sechi, C. Sriskandarajah, G. Sorger, J. Blazewicz, and W. Kubiak, "Sequencing of parts and robot moves in a robotic cell," Int. J. Flexible Manuf. Syst., vol. 4, no. 3-4, pp. 331-358, 1992.
S. Venkatesh, R. Davenport, P. Foxhoven, and J. Nulman, "A steady state throughput analysis of cluster tools: Dual-blade versus single-blade robots", *IEEE Trans. Semiconduct. Manuf*., vol.10, no. 4, pp. 418-424, 1997.
N. Q. Wu, C. B. Chu, F. Chu, and M. C. Zhou, "A Petri net method for schedulability and scheduling problems in single-arm cluster tools with wafer residency time constraints," *IEEE Transactions on Semiconductor Manufacturing*, vol. 21, no. 2, pp. 224-237, 2008.

N. Q. Wu, F. Chu, C. Chu, and M. Zhou, "Petri Net-Based Scheduling of Single-Arm Cluster Tools With Reentrant Atomic Layer Deposition Processes," *IEEE Transactions on Automation Science and Engineering*, vol. 8, no. 1, pp. 42-55, 2011.

N. Q. Wu, F. Chu, C. B. Chu, and M. C. Zhou, "Petri net modeling and cycle time analysis of dual-arm cluster tools with wafer revisiting," *IEEE Transactions on Systems, Man, & Cybernetics*: Systems, vol. 43, no. 1, pp. 196-207, 2013a.

N. Q. Wu and M. Zhou, "Analysis of wafer sojourn time in dual-arm cluster tools with residency time constraint and activity time variation," *IEEE Transactions on Semiconductor Manufacturing*, vol. 23, no. 1, pp. 53-64, 2010a.

N. Q. Wu and M. C. Zhou, "A closed-form solution for schedulability and optimal scheduling of dual-arm cluster tools based on steady schedule analysis," *IEEE Transactions on Automation Science and Engineering*, vol. 7, no. 2, 303-315, 2010b.

N. Q. Wu and M. C. Zhou, Colored timed Petri nets for modeling and analysis of cluster tools, Asian Journal of Control, vol. 12, no. 3, 253-266, 2010c.

N. Q. Wu and M. C. Zhou, "Modeling, analysis and control of dual-arm cluster tools with residency time constraint and activity time variation based on Petri nets," *IEEE Transactions on Automation Science and Engineering*, vol. 9, no. 2, 446-454, 2012a.

N. Q. Wu and M. C. Zhou, "Schedulability analysis and optimal scheduling of dual-arm cluster tools with residency time constraint and activity time variation," *IEEE Transactions on Automation Science and Engineering*, vol. 9, no. 1, 203-209, 2012b.

N. Q. Wu, M. C. Zhou, F. Chu, and C. B. Chu, A Petri-net-based scheduling strategy for dual-arm cluster tools with wafer revisiting, *IEEE Transactions on Systems, Man, & Cybernetics: Systems*, vol. 43, no. 5, 1182-1194, 2013b.

W. M. Zuberek, "Timed Petri nets in modeling and analysis of cluster tools," *IEEE Transactions on Robotics Automation*, vol. 17, no. 5, pp. 562-575, October 2001.

W. M. Zuberek, "Cluster tools with chamber revisiting—modeling and analysis using timed Petri nets", IEEE Transactions on Semiconductor Manufacturing, vol. 17, no. 3, 333-344, 2004.

With a single-wafer processing technology, cluster tools are widely used for wafer fabrication in semiconductor manufacturing. A typical cluster tool has several process modules (PMs), two loadlocks, and a wafer handling robot with a radical layout as shown in FIG. 1. Equipped with one or two arms for the robot, the corresponding tool is called a single or dual-arm cluster tool. Cassettes with lots of raw wafers are loaded into or unloaded from a cluster tool through the loadlocks. A wafer is unloaded from the loadlock by the robot and delivered to one or more PMs for processing in a pre-specified order decided by a recipe. Often, the wafers in a cassette have an identical recipe. A wafer should stay in a PM for a minimum time to be processed. After all operations are completed, it returns to the cassette from which it comes [Wu et al., 2010b]. When all the wafers in a cassette are processed, the cassette is unloaded from the loadlock such that another cassette can be loaded. In this way, with two loadlocks, a cluster tool can operate consecutively without interruption.

Cluster tools are a kind of robotic cells and a robotic cell is a flow-shop with blocking [Pinedo, 1995]. Extensive work has been done for the operation of a robotic cell [Brauner, 2008; Crama et al., 1997 and 2000; Dawande et al., 2002, 2007 and 2009; Geismar et al., 2006 and 2008; Sechi et al., 1992 and 2001]. They mainly focus on a flow-shop operation mode with one part type to be processed and a processed part can stay at a machine for an unlimited time. A cyclic schedule is called a k-unit schedule if exactly k parts are produced during every period [Sechi et al., 1992]. When k=1, it is a one-unit cyclic schedule. Owing to its easy implementation, one-unit cyclic schedule is the most desired in practice assuming that all the schedules achieve the same maximum throughput.

To effectively operate a single-cluster tool, plenty of studies have been done [Venkatesh et al., 1997; Perkinson et al., 1994 and 1996; Zuberek, 2001; Wu et al., 2011 and 2013; and Wu and Zhou, 2010a, 2012a, and 2012b]. They show that a cluster tool mostly operates under a steady state. If the robot is the bottleneck and the robot task time decides the cycle time of a tool, the tool operates in a transport-bound region. Contrarily, if the wafer processing time dominates the process and decides the cycle time, it operates in a process-bound region. In practice, the robot task time is much shorter than the wafer processing time [Lee et al., 2004; Lopez and Wood, 2003]. Thus, a single-arm cluster tool is mostly process-bound and a backward scheduling strategy is shown to be optimal [Lee et al., 2004; Lopez and Wood, 2003].

Some wafer fabrication processes impose strict wafer residency time constraints in a PM, which requires that a processed wafer be removed from the PM within a limited time, otherwise it suffers from serious quality problem [Kim et al., 2003; Lee and Park, 2005]. With such constraints, the scheduling problem of cluster tools becomes very complicated and challenging. Methods are developed in [Kim et al., 2003; Lee and Park, 2005] to schedule dual-arm cluster tools with wafer residency time constraints for cyclic scheduling. With Petri net models and robot waiting concept, much more efficient techniques are presented in [Wu et al., 2008; and Wu and Zhou, 2010a] for scheduling both single and dual-arm cluster tools.

In wafer fabrication, a wafer may need to visit some processing steps several times, leading to a revisiting process. Atomic layer deposition (ALD) is a typical revisiting process in the semiconductor manufacturing [Lee, et al., 2006]. With wafer revisiting, it is challenging to schedule a cluster tool. All the aforementioned studies are conducted on cluster tools for non-revisiting processes. To explore the potential in operating a cluster tool with wafer revisiting, methods are presented for performance evaluation by using Petri net models in [Zuberek, et al., 2004; and Wu and Zhou, 2010c] without providing a scheduling technique. Lee, et al. [2006] study the scheduling problem of single-arm cluster tools with wafer revisiting for the first time. In their work, based on a Petri net model, the problem is formulated as a mixed integer programming such that an optimal schedule can be found. This problem is further investigated in [Wu, et al., 2011] for the ALD process by using Petri net model and analytical expressions are derived to find the optimal schedule. For dual-arm cluster tools with wafer revisiting, based on a Petri net model, Wu et al., [2013a] find that, by using a swap strategy, the system may never enter a steady state and analytical expressions are presented to correctly calculate the cycle time. Based on this finding, effective methods are developed to schedule such dual-arm cluster tools in [Wu et al., 2013b; and Qiao et al., 2013].

With both wafer residency time constraints and revisiting, the scheduling problem of cluster tools is very complicated. Based on the scheduling strategy proposed in [Qiao et al., 2013], effective techniques are developed to schedule dual-arm cluster tools for the ALD process with wafer residency time constraints for different situations in [Qiao et al., 2014a and 2014b]. Up to now, there is no research report on scheduling single-cluster tools with both wafer residency time constraints and wafer revisiting. Notice that, with wafer revisiting, it is more difficult to balance the workloads among the steps for a single-arm cluster tool than for a dual-arm cluster tool, thereby, leading to a more difficult problem to schedule a single-arm tool than a dual-arm one.

There is a need in the art for a method to obtain a schedule when wafer revisiting process and residency time constraints are taken into consideration.

SUMMARY OF THE INVENTION

An aspect of the present invention is to provide a computer implemented method for scheduling a single-arm cluster tool with wafer revisiting process and residency time constraints.

According to an embodiment of the present claimed invention, a computer implemented method for scheduling a single-arm cluster tool with wafer revisiting process and residency time constraints comprises: obtaining, by a processor, a wafer processing time, a wafer residency time, a robot task time for loading/unloading a wafer, and a robot task time for robot's moving; determining, by a processor, a cycle time for the wafer revisiting process based on the wafer processing time, the robot task time for loading/unloading the wafer, and the robot task time for robot's moving; determining, by a processor, a cycle time of system based on the wafer processing time, the robot task time for loading/unloading the wafer, and the robot task time for robot's moving; determining, by a processor, a case of an algorithm from a plurality of defined cases of algorithms based on the wafer processing time, the determined cycle time for the wafer revisiting process, and the determined cycle time of system; determining, by a processor, a robot scheduling strategy based on the determined case of the algorithm, wherein the robot scheduling strategy comprises a plurality of basic activity sequences; determining, by a processor, a robot waiting time based on the wafer residency time and the determined case of the algorithm; and generating, by a processor, a schedule based on the determined robot scheduling strategy and the determined robot waiting time.

The present invention makes the following contributions: 1) schedulability conditions under which a feasible cyclic schedule exists are proposed; and 2) If schedulable, closed-form algorithms are developed to find the optimal schedule.

With wafer revisiting and wafer residency time constraints, it is highly challenging to schedule a cluster tool. For an ALD process, the present invention solves such a scheduling problem for single-arm cluster tools with wafer flow pattern (PM1, (PM2, PM3)$^2$). Based on a prior work [Wu, et al., 2011], different strategies for scheduling the robot task sequence are proposed and analyzed. Then, for different cases, schedulability analysis is conducted and schedulability conditions are established. If schedulable, scheduling algorithms are proposed such that a feasible and optimal schedule is swiftly found. Thus, the method of the present invention represents a significant advancement in this research field.

The results obtained are for ALD process with the wafer flow pattern (PM1, (PM2, PM3)$^2$), which looks very simple but its optimal scheduling task is actually much more complicated than one might think or in comparison with a non-revisiting process.

DETAILED DESCRIPTION

In the following description, a computer implemented method for scheduling single-arm cluster tools with wafer revisiting process and residency time constraints is set forth as preferred examples. It will be apparent to those skilled in the art that modifications, including additions and/or substitutions maybe made without departing from the scope and spirit of the invention. Specific details may be omitted so as not to obscure the invention; however, the disclosure is written to enable one skilled in the art to practice the teachings herein without undue experimentation.

Accordingly, Section A briefly introduces the ALD process and presents the robot task sequencing strategies. Based on them, schedulability conditions and scheduling algorithms are derived in Section B. Illustrative examples are used to show the obtained results in Section C.

A. Fabrication Process and Scheduling Strategies

A.1 A. Atomic Layer Deposition Process

As a typical wafer fabrication process in semiconductor manufacturing, ALD controls the deposition film thickness by adjusting the number of repeating times such that a monoatomic layer precision can be obtained. Furthermore, it uses much lower processing temperature, i.e., 100° C.-400° C., rather than 550° C.-800° C. for chemical vapor deposition. Hence, ALD is increasingly used in the semiconductor industry.

Figure 1:
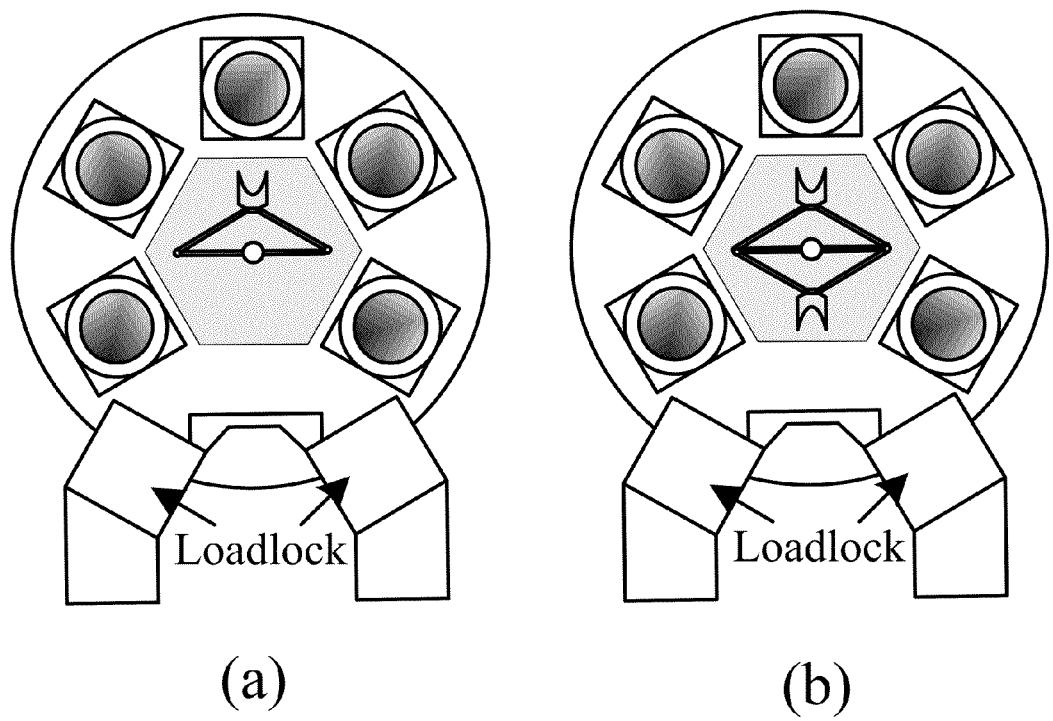
FIG. 1 shows cluster tools: (a) single-arm tool, and (b) dual-arm tool.
Figure 2:
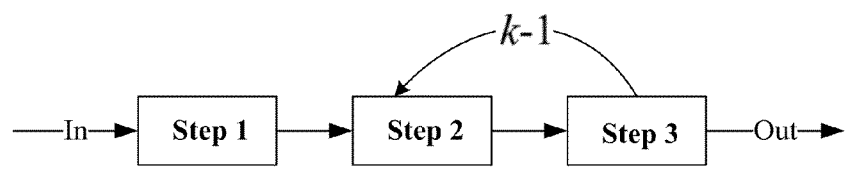
FIG. 2 illustrates an ALD process (k>1)

In an ALD process, there are three steps as shown in FIG. 2, a wafer visits Step 1 first, then Step 2 and followed by Step 3. After that, it goes back to Step 2 and then Step 3 again and this process is performed for a total of k($\geq$2) times, where k is decided by a process plan. In a cluster tool, multiple PMs may be configured for some steps to balance the workload among the steps. However, for a revisiting process, when a wafer revisits a processing step, the same processing environment is required as the wafer visits the prior step. With such a requirement, for the ALD process, often, only one PM is configured for a step to guarantee uniformity. An embodiment of the present invention focuses on the ALD process with one PM being configured for each step. Let PM1-PM3 be the PMs for Steps 1-3, respectively. Then, the wafer flow pattern of an ALD process can be denoted as (PM1, (PM2, PM3)$^k$) with (PM2, PM3)$^k$ being a k-revisiting process. For the simplicity of presentation, one considers the case of k=2 only. Nevertheless, the obtained results for k=2 can be extended to cases of k>2. With k=2, the wafer flow pattern is (PM1, (PM2, PM3)$^2$).

A.2 Activity Description

The loadlocks in a cluster tool can be treated as a processing step, as denoted by $PM_0$. In operating a cluster tool, the robot tasks include: unloading a processed wafer from a PM, moving from one PM to another with a wafer, loading a wafer into a PM for processing, moving from one PM to another without a wafer, and waiting. Given the status of a cluster tool and the wafer processing information, the key to schedule a cluster tool is to schedule its robot tasks.

TABLE 1

THE TIME DURATIONS ASSOCIATED WITH EACH ACTIVITY

| Symbol | Action | Time |
| --- | --- | --- |
| $u_i/l_i$ | The robot unloads/loads a wafer from/into Step i, i ∈ $\Omega_3$ | $\lambda$ |
| $m_{ij}$ | The robot's moving from Steps i to j with or without carrying a wafer, i, j ∈ $\Omega_3$ | $\mu$ |
| $m^1_{23}$ and $m^2_{23}$ | The robot's moving from Step 2 to 3 with the same wafer hold for the first and second time, respectively | $\mu$ |

Therefore, for scheduling of a single-arm cluster tool, the system is described as follows. Let $u_i$ and $l_i$ denote the robot unloading and loading a wafer from and into $PM_i$, $i \in \Omega_3 = \{0, 1, 2, 3\}$, respectively. Further, let $m_{ij}$, $i,j \in \Omega_3$, except $m_{23}$, denote the robot's moving from Steps i to j, and $m^1_{23}$ and $m^2_{23}$ denote its moving from Step 2 to 3 holding the same wafer for the first and second time, respectively.

Correspondingly, the temporal aspect for each robot activity is described as follows. The time taken for robot tasks $u_i$ and $l_i$ is identical and denoted by $\lambda$; and the time taken for $m_{ij}$ except $m_{23}$, $i,j \in \Omega_3$, $m^1_{23}$, and $m^2_{23}$ is also same and denoted by $\mu$. Let $\omega_{i,j}$, $i,j \in \Omega_3$, except $\omega_{23}$, denote the time taken for the robot's waiting before unloading a wafer from $PM_i$ to move to $PM_j$ and, $\omega^1_{23}$ and $\omega^2_{23}$ the time for its waiting before unloading the same wafer from $PM_2$ to move to $PM_3$ for the first and second time, respectively.

Apart from the robot tasks, the wafer processing in a PM also takes time. Note that there is no processing requirement in the loadlocks. Thus, one uses $\alpha_i$ to denote the time taken for processing a wafer in $PM_i$, $i \in N_3 = \{1, 2, 3\}$. With wafer residency constraints, a processed wafer should be unloaded from $PM_i$ within a limited time $\delta_i$, which implies that a wafer can stay in $PM_i$ for a duration that lies in the interval $[\alpha_i, \alpha_i+\delta_i]$ without suffering from a quality problem. Let $\tau_i \in [\alpha_i, \alpha_i+\delta_i]$ denote the wafer sojourn time in $PM_i$. The time duration for each activity is listed in Table I. In practice, as the robot task time is much shorter than wafer processing time, it is reasonable to assume that $\alpha_i \geq 5(\mu+\lambda)$, $i \in N_3$.

It is known that a single-arm cluster tool for the ALD process is deadlock-prone [Lee and Lee, 2006; and Wu, et al., 2011]. However, this problem can be solved by using the policy presented in [Wu, et al., 2011]. Then, for a single-arm cluster tool with wafer revisiting and residency time constraints, according to [Wu et al., 2008; and Wu and Zhou, 2010b], the following schedulability definition is presented.

Definition 1 [Wu et al., 2008; and Wu and Zhou, 2010b]: Given wafer sojourn time interval $[\alpha_i, \alpha_i+\delta_i]$ for Step i, $i \in N_3$, if there exists a schedule such that whenever $u_i$ is performed, $\alpha_i \leq \tau_i \leq \alpha_i+\delta_i$ holds, then, a single-arm cluster tool with wafer revisiting and residency time constraints is schedulable.

A.3 Scheduling Strategy

Following the idea in [Chan, et. al., 2011a and b], to simplify the presentation, one defines a basic activity sequence $A_{ij} = \langle m_{xi}$ (without carrying a wafer)$\rightarrow u_i \rightarrow m_{ij} \rightarrow l_j\rangle$, $i,j \in \Omega_3$, where $m_{xi}$ denotes that the robot can come to Step i from any Step x. Notice that x=i may hold, or the task before performing $A_{ij}$ is $l_i$. This means that, to perform $A_{ij}$, the robot is already at Step i. In this case, $A_{ij} = \langle u_i \rightarrow m_{ij} \rightarrow l_j\rangle$ and it is denoted as $A_{ij} \backslash \{m_{ii}\}$ to indicate that $m_{ii}$ takes no time. Also, $A^1_{23}$ and $A^2_{23}$ are defined in a similar way. With them, one can describe a schedule by presenting the robot task sequence with no robot waiting being taken into consideration.

Figure 3:
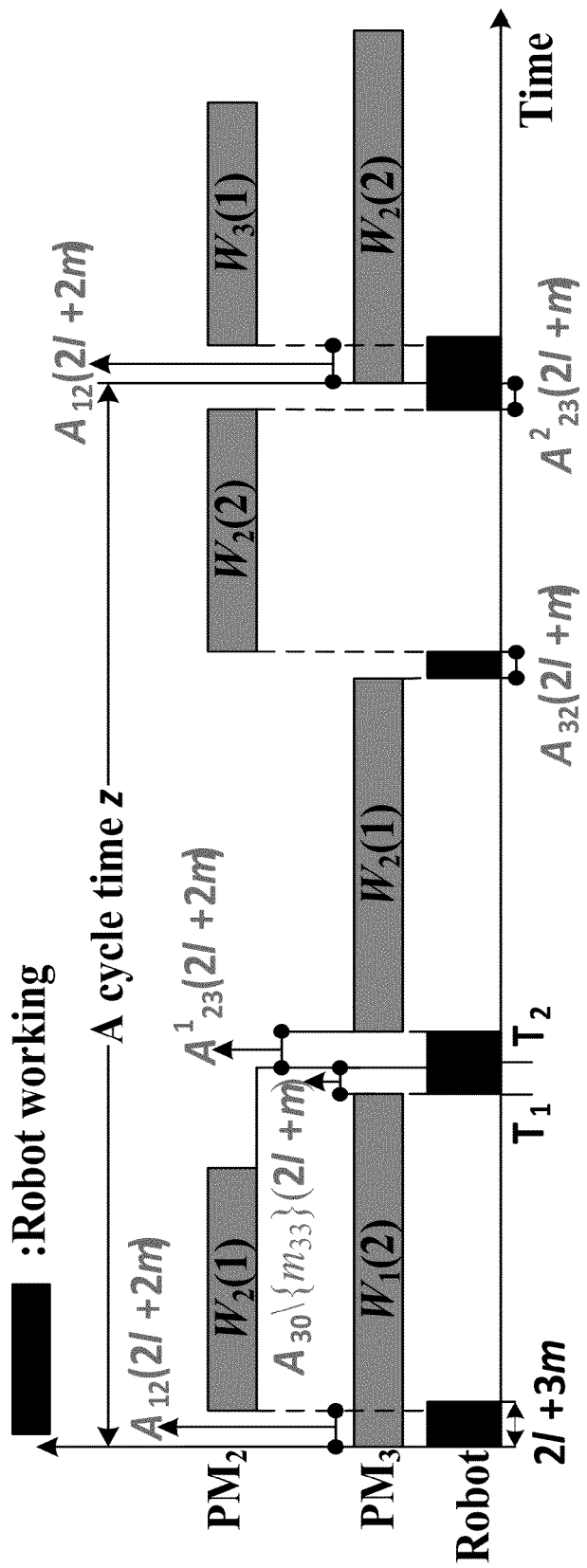
FIG. 3 depicts a Gantt chart for the schedule of wafer revisiting process (PM2, PM3)$^2$.

According to Wu, et al. [2011], without wafer residency time constraints, the optimal one-wafer cyclic schedule for (PM2, PM3)$^2$ is deterministic and unique and such a schedule can be described as $A^2_{23}A_{12}A_{30}A^1_{23}A_{32}$. Let $W_d(q)$ in $PM_i$, $d \in \{1, 2, 3, \ldots\}$, $q \in N_2$, and $i \in N_3$, denote the d-th wafer being processed in $PM_i$ for the q-th time. The Gantt chart for the optimal one-wafer cyclic schedule of wafer revisiting process (PM2, PM3)$^2$ is illustrated in FIG. 3. In FIG. 3, "$A_{12}(2\lambda+2\mu)$" means that $A_{12}$ is performed and it takes $2\lambda+2\mu$ time units. The meaning of "$A^1_{23}(2\lambda+2\mu)$", "$A_{32}(2\lambda+\mu)$", "$A^2_{23}(2\lambda+\mu)$", and "$A_{30}\backslash\{m_{33}\}(2\lambda+\mu)$" is similar. From FIG. 3, one can observe that after $A_{12}(2\lambda+2\mu)$ is performed, the robot comes to $PM_3$ by performing $m_{23}$ immediately, and the time taken by $A_{12}$ together with $m_{23}$ is $2\lambda+3\mu$. As $2\lambda+3\mu<\alpha_3$, when $W_1(2)$ is processed in $PM_3$, the robot is already at Step 3. In other words, at time $T_1$, $m_{23}$ in $A_{30}$ has been already performed. Hence, during the time between $T_1$ and $T_2$, the task performed is $A_{30}\backslash\{m_{33}\}$ with $2\lambda+\mu$ time units being taken. For this schedule, the cycle time for the revisiting process is $\zeta$=Max$\{2\lambda+3\mu, \alpha_2, \alpha_3\}+(4\lambda+3\mu)+(4\lambda+2\mu+\alpha_2+\alpha_3)=8\lambda+5\mu+\alpha_2+\alpha_3+$Max$\{\alpha_2, \alpha_3\}$.

Let $\Theta$ be the cycle time of the whole system. One has $\Theta=\zeta$ or $\Theta>\zeta$. If $\Theta=\zeta$, the robot activity sequence for the revisiting process (PM2, PM3)$^2$ in the schedule for the entire system should be same as that in the optimal one-wafer cyclic schedule for (PM2, PM3)$^2$, or it is $A^2_{23}A_{12}A_{30}A^1_{23}A_{32}$. Then, to obtain a schedule for the entire system, the key is to decide when $A_{01}$ should be performed while satisfying the wafer residency time constraints. There are totally five possible robot task sequences for the entire system, i.e., 1) $A^2_{23}A_{01}A_{12}A_{30}A^1_{23}A_{32}$; 2) $A^2_{23}A_{12}A_{01}A_{30}A^1_{23}A_{32}$; 3) $A^2_{23}A_{12}A_{30}A_{01}A^1_{23}A_{32}$; 4) $A^2_{23}A_{12}A_{30}A^1_{23}A_{01}A_{32}$; and 5) $A^2_{23}A_{12}A_{30}A^1_{23}A_{32}A_{01}$, leading to five different strategies. One needs to analyze them, respectively.

For Case 1): $A^2_{23}A_{01}A_{12}A_{30}A^1_{23}A_{32}$, i.e., without robot waiting, the robot activity sequence is $\sigma_1 = \langle$ unloading a wafer from $PM_2$ ($\lambda$)$\rightarrow$moving to $PM_3$ ($\mu$)$\rightarrow$loading a wafer into $PM_3$ ($\lambda$)$\rightarrow$moving to $PM_0$ ($\mu$)$\rightarrow$unloading a wafer from $PM_0$ ($\lambda$)$\rightarrow$moving to $PM_1$ ($\mu$)$\rightarrow$loading a wafer into $PM_1$ ($\lambda$)$\rightarrow$unloading a wafer from $PM_1$ ($\lambda$)$\rightarrow$moving to $PM_2$ ($\mu$)$\rightarrow$loading a wafer into $PM_2$ ($\lambda$)$\rightarrow$moving to $PM_3$ ($\mu$)$\rightarrow$unloading a wafer from $PM_3$ ($\lambda$)$\rightarrow$moving to $PM_0$ ($\mu$)$\rightarrow$loading a wafer into $PM_0$ ($\lambda$)$\rightarrow$moving to $PM_2$ ($\mu$)$\rightarrow$unloading a wafer from $PM_2$ ($\lambda$)$\rightarrow$moving to $PM_3$ ($\mu$)$\rightarrow$loading a wafer into $PM_3$ ($\lambda$)$\rightarrow$unloading a wafer from $PM_3$ ($\lambda$)$\rightarrow$moving to $PM_2$ ($\mu$)$\rightarrow$loading a wafer into $PM_2$ ($\lambda$)$\rangle$. Therefore, in this case, the robot cycle time without waiting for the entire system is $$\psi_{11}=12\lambda+9\mu \qquad (1)$$

For Case 2): $A^2_{23}A_{12}A_{01}A_{30}A^1_{23}A_{32}$, the robot activity sequence is $\sigma_2 = \langle$ unloading a wafer from $PM_2$ ($\lambda$)$\rightarrow$moving to $PM_3$ ($\mu$)$\rightarrow$loading a wafer into $PM_3$ ($\lambda$)$\rightarrow$moving to $PM_1$ ($\mu$)→unloading a wafer from PM$_1$ ($\lambda$)→moving to PM$_2$ ($\mu$)→loading a wafer into PM$_2$ ($\lambda$)→moving to PM$_0$ ($\mu$)→unloading a wafer from PM$_0$ ($\lambda$)→moving to PM$_1$ ($\mu$)→loading a wafer into PM$_1$ ($\lambda$)→moving to PM$_3$ ($\mu$)→unloading a wafer from PM$_3$ ($\lambda$)→moving to PM$_0$ ($\mu$)→loading a wafer into PM$_0$ ($\lambda$)→moving to PM$_2$ ($\mu$)→unloading a wafer from PM$_2$ ($\lambda$)→moving to PM$_3$ ($\mu$)→loading a wafer into PM$_3$ ($\lambda$)→unloading a wafer from PM$_3$ ($\lambda$)→moving to PM$_2$ ($\mu$)→loading a wafer into PM$_2$ ($\lambda$)⟩. Hence, one has $$\psi_{21}=12\lambda+10\mu \quad (2)$$

Similarly, for Cases 3) $A^2_{23}A_{12}A_{30}A_{01}A^1_{23}A_{32}$, 4) $A^2_{23}A_{12}A_{30}A^1_{23}A_{01}A_{32}$, and 5) $A^2_{23}A_{12}A_{30}A^1_{23}A_{32}A_{01}$, one has $$\psi_{31}=12\lambda+9\mu \quad (3)$$

$$\psi_{41}=12\lambda+11\mu \quad (4)$$

$$\psi_{51}=12\lambda+11\mu \quad (5)$$

If $\Theta>\zeta$, it implies that the wafer processing time in PM$_1$ decides the cycle time of the system. In this case, to obtain an optimal schedule, after performing $A_{12}$, one should perform $A_{01}$ immediately to keep PM$_1$, the bottleneck of the system, working. Furthermore, according to the fabrication requirements, $A_{12}$ and $A_{30}$ should be performed before $A^1_{23}$, and $A^1_{23}$ before $A_{32}$. Therefore, there are two different strategies only, i.e., Case 6): $A^2_{23}A_{30}A_{12}A_{01}A^1_{23}A_{32}$ and Case 7): $A^2_{23}A_{12}A_{01}A_{30}A^1_{23}A_{32}$.

For Case 6, one has $\sigma_6=\langle$unloading a wafer from PM$_2$ ($\lambda$)→moving to PM$_3$ ($\mu$)→loading a wafer into PM$_3$ ($\lambda$)→unloading a wafer from PM$_3$ ($\lambda$)→moving to PM$_0$ ($\mu$)→loading a wafer into PM$_0$ ($\lambda$)→moving to PM$_1$ ($\mu$)→unloading a wafer from PM$_1$ ($\lambda$)→moving to PM$_2$ ($\mu$)→loading a wafer into PM$_2$ ($\lambda$)→moving to PM$_0$ ($\mu$)→unloading a wafer from PM$_0$ ($\lambda$)→moving to PM$_1$ ($\mu$)→loading a wafer into PM$_1$ ($\lambda$)→moving to PM$_2$ ($\mu$)→unloading a wafer from PM$_2$ ($\lambda$)→moving to PM$_3$ ($\mu$)→loading a wafer into PM$_3$ ($\lambda$)→unloading a wafer from PM$_3$ ($\lambda$)→moving to PM$_2$ ($\mu$)→loading a wafer into PM$_2$ ($\lambda$)⟩. Thus, the robot cycle time without waiting is $$\psi_{61}=12\lambda+9\mu \quad (6)$$

For Case 7, it is same as Case 2, and the robot cycle time without waiting is $$\psi_{71}=12\lambda+10\mu \quad (7)$$

With the above analysis, one discusses the schedulability and scheduling method next by examining the above cases for scheduling the robot task sequence.

B. Schedulability and Scheduling

In this section, based on $\Theta=\zeta$ or $\Theta>\zeta$, one studies the schedulability and scheduling problem by examining each of the above robot scheduling strategies. For any above given robot scheduling strategy, if a schedule exists, an algorithm is derived to find it by setting the robot waiting time simply.

A. $\Theta=\zeta$ and $\alpha_2\leq\alpha_3$

With $\alpha_2\leq\alpha_3$, one has $\zeta=8\lambda+5\mu+\alpha_2+\alpha_3+\text{Max}\{\alpha_2,\alpha_3\}=8\lambda+5\mu+\alpha_2+2\alpha_3$. If a schedule is obtained by robot task sequence $A^2_{23}A_{01}A_{12}A_{30}A^1_{23}A_{32}$ or Case 1, the Gantt chart can be shown in FIG. 4 where the highlighted path with red color is the critical one. This implies that, to obtain an optimal schedule, one should find no delay along this path. With this observation, the robot task sequence can be equivalently denoted as $A_{01}A_{12}A_{30}A_{123}A_{32}A^2_{23}$.

Figure 4:
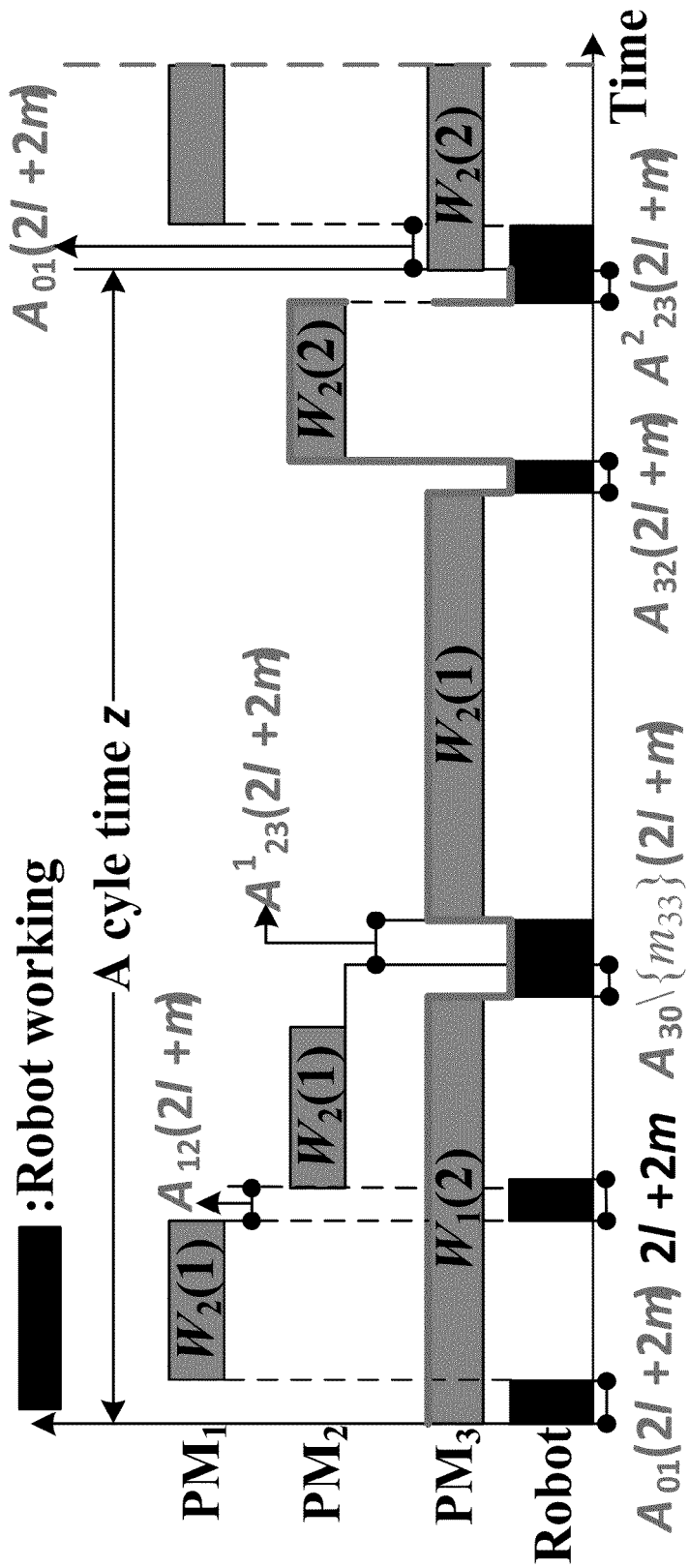
FIG. 4 depicts a Gantt chart of sequence $A^2_{23}A_{01}A_{12}A_{30}A^1_{23}A_{32}$ with $\alpha_2 \leq \alpha_3$.

It follows from the Gantt chart in FIG. 4 that, to make $\Theta=\zeta$, $2\lambda+2\mu+\alpha_1+2\lambda+\mu+\alpha_2\leq\alpha_3+(2\lambda+\mu)+\mu \Rightarrow \alpha_1+\alpha_2+2\lambda+\mu\leq\alpha_3$ must hold. Let $\psi_{i2}$, $i\in N_7$, be the robot waiting time in a cycle. Then, for $A^2_{23}A_{01}A_{12}A_{30}A^1_{23}A_{32}$, one has $\psi_{12}=\zeta-\psi_{11}=(8\lambda+5\mu+\alpha_2+2\alpha_3)-(12\lambda+9\mu)=2\alpha_3+\alpha_2-4\lambda-4\mu$. In this case, it follows from FIG. 4 that $W_1(2)$, $W_2(1)$, and $W_2(2)$ are unloaded immediately after being processed in PM$_3$, PM$_3$, and PM$_2$, respectively. Thus, wafer residency time constraints may be violated for only $W_2(1)$ and $W_2(1)$ that are processed in PM$_1$ and PM$_2$, respectively. To obtain a feasible schedule if it exists, the key is to assign $\psi_{12}$ into $\omega_{ij}$'s properly. To do so, one presents the following algorithm.

Algorithm 1: If $\Theta=\zeta$ with $\alpha_1+\alpha_2+2\lambda+\mu\leq\alpha_3$ and the robot task sequence is $A^2_{23}A_{01}A_{12}A_{30}A^1_{23}A_{32}$, $\omega_{ij}$'s are set as follows to obtain a one-wafer cyclic schedule if it exists.
 i. Q=1.
 ii. If $\alpha_3\leq\alpha_1+\alpha_2+2\lambda+\mu+\delta_1$
   2.1. $\omega_{01}=0$, $\omega_{12}=\alpha_3-\alpha_2-2\lambda-\mu$, $\omega_{30}=\alpha_3-4\lambda-4\mu-\omega_{12}$, $\omega^1_{23}=0$, $\omega_{32}=\alpha_3$, and $\omega^2_{23}=\alpha_2$;
   2.2. Go to Step vi.
 iii. If $\alpha_3\leq\alpha_1+\alpha_2+2\lambda+\mu+\delta_2$
   3.1. $\omega_{01}=0$, $\omega_{12}=\alpha_1$, $\omega_{30}=\alpha_3-4\lambda-4\mu-\omega_{12}$, $\omega^1_{23}=0$, $\omega_{32}=\alpha_3$, and $\omega^2_{23}=\alpha_2$;
   3.2. Go to Step vi.
 iv. If $\alpha_1+\alpha_2+2\lambda+\mu+\delta_1<\alpha_3$, $\alpha_1+\alpha_2+2\lambda+\mu+\delta_2<\alpha_3$, and $\alpha_1+\alpha_2+2\lambda+\mu+\delta_1+\delta_2\geq\alpha_3$
   4.1. $\omega_{01}=0$, $\omega_{12}=\alpha_1+\delta_1$, $\omega_{30}=\alpha_3-4\lambda-4\mu-\omega_{12}$, $\omega^1_{23}=0$, $\omega_{32}=\alpha_3$, and $\omega^2_{23}=\alpha_2$;
   4.2. Go to Step vi.
 v. If $\alpha_1+\alpha_2+2\lambda+\mu+\delta_1+\delta_2<\alpha_3$
   5.1. $\omega_{01}=\alpha_3-(\alpha_1+\alpha_2+2\lambda+\mu+\delta_1+\delta_2)$;
   5.2. If $\omega_{01}>\alpha_3-4\lambda-4\mu-\alpha_1-\delta_1$, Q=0 and go to Step vi;
   5.3. Otherwise, $\omega_{12}=\alpha_1+\delta_1$, $\omega_{30}=\alpha_3-4\lambda-4\mu-\omega_{12}-\omega_{01}$, $\omega^1_{23}=0$, $\omega_{32}=\alpha_3$, and $\omega^2_{23}=\alpha_2$;
   5.4. Go to Step vi.
 vi. Return Q and end.

By Algorithm 1, $\alpha_1+\alpha_2+2\lambda+\mu\leq\alpha_3$. Thus, for Case ii, with $\alpha_i\geq5(\mu+\lambda)$, one has $\omega_{12}=\alpha_3-\alpha_2-2\lambda-\mu\geq\alpha_1>0$, $\omega_{30}=\alpha_3-4\lambda-4\mu-(\alpha_3-\alpha_2-2\lambda-\mu)=\alpha_2-2\lambda-3\mu>0$. For Case iii, $\omega_{30}=\alpha_3-4\lambda-4\mu-\alpha_1\geq\alpha_2-2\lambda-3\mu>0$. For Case iv, $\omega_{30}=\alpha_3-4\lambda-4\mu-(\alpha_1+\delta_1)>(\alpha_1+\alpha_2+2\lambda+\mu+\delta_1)-4\lambda-4\mu-(\alpha_1+\delta_1)=\alpha_2-2\lambda-3\mu>0$. For Case v, if Q=1 is returned, $0<\omega_{01}=\alpha_3-(\alpha_1+\alpha_2+2\lambda+\mu+\delta_1+\delta_2)\leq\alpha_3-4\lambda-4\mu-\alpha_1-\delta_1$, leading to $\omega_{30}=\alpha_3-4\lambda-4\mu-\omega_{12}-\omega_{01}\geq0$. Hence, any robot waiting time set by Algorithm 1 is non-negative if Q=1 is returned. Furthermore, for each case, one has $\psi_{12}=\omega_{01}+\omega_{12}+\omega_{30}+\omega^2_{23}+\omega_{32}+\omega^1_{23}=2\alpha_3+\alpha_2-4\lambda-4\mu$ such that $\Theta=\Theta=\psi_{11}+\psi_{12}$. The following theorem presents the feasibility of the schedule obtained by Algorithm 1.

Theorem 1: Assume that: 1) the cycle time of the system is $\Theta=\zeta$ with $\alpha_1+\alpha_2+2\lambda+\mu\leq\alpha_3$, 2) the robot task sequence is $A^2_{23}A_{01}A_{12}A_{30}A^1_{23}A_{32}$, and 3) the robot waiting time is set by Algorithm 1 with Q=1 being returned. Then, the obtained one-wafer cyclic schedule is feasible.

Proof: One needs to show that the wafer residency time constraints are satisfied for only $W_2(1)$ and $W_2(1)$ that are processed in PM$_1$ and PM$_2$, respectively. Let $\tau_i$ denote the wafer sojourn time in PM$_i$. It follows from FIG. 4 that, for Case ii and $W_2(1)$ in PM$_1$, one has $\tau_1=\omega_{12}=\alpha_1+[\alpha_3-(\alpha_1+\alpha_2+2\lambda+\mu)]$. By assumption, $0\leq\alpha_3-(\alpha_1+\alpha_2+2\lambda+\mu)\leq\delta_1$. Hence, one has $\alpha_1\leq\tau_1\leq\alpha_1+\delta_1$. To calculate $\tau_2$, let $T_1$ be the time instant when a wafer is just loaded into a PM and $T_u$ be the time instant when the robot begins to unload a wafer from a PM. For $W_2(1)$ in PM$_2$, from FIG. 4, one has $T_l=2\lambda+2\mu+\omega_{12}+2\lambda+\mu$ and $T_u=\alpha_3+2\lambda+2\mu$, leading to $\tau_2=T_u-T_l=\alpha_3+2\lambda+2\mu-(2\lambda+2\mu+\omega_{12}+2\lambda+\mu)=\alpha_2$. The wafer residency time constraints are satisfied for both of them. For Case iii, $\tau_1=\omega_{12}=\alpha_1$ and $\tau_2=T_u-T_l=\alpha_3+2\lambda+2\mu-(2\lambda+2\mu+\omega_{12}+2\lambda+\mu)=\alpha_3-\alpha_1-2\lambda- $\mu$. Since $\alpha_2 \leq \alpha_3 - \alpha_1 - 2\lambda - \mu \leq \alpha_2 + \delta_2$, one has $\alpha_2 \leq \tau_2 \leq \alpha_2 + \delta_2$. For Case iv, $\tau_1 = \omega_{12} = \alpha_1 + \delta_1$ and $\tau_2 = T_u - T_l = \alpha_3 + 2\lambda + 2\mu - (2\lambda + 2\mu + \omega_{12} + 2\lambda + \mu) = \alpha_3 - \alpha_1 - \delta_1 - 2\lambda - \mu$. Since $(\alpha_1 + \alpha_2 + 2\lambda + \mu + \delta_1) - \alpha_1 - \delta_1 - 2\lambda - \mu = \alpha_2 \leq \alpha_3 - \delta_1 - 2\lambda - \mu \leq (\alpha_1 + \alpha_2 + 2\lambda + \mu - \delta_1 + \delta_2) - \alpha_1 - \delta_1 - 2\lambda - \mu = \alpha_2 + \delta_2$, one has $\alpha_2 \leq \tau_2 \leq \alpha_2 + \delta_2$. For Case v, $\tau_1 = \omega_{12} = \alpha_1 + \delta_1$ and $\tau_2 = T_u - T_l = \alpha_3 + 2\lambda + 2\mu - (2\lambda + 2\mu + \omega_{12} + \omega_{01} + 2\lambda + \mu) = \alpha_2 + \delta_2$. Hence, for all cases, the wafer residency time constraints are satisfied.

Figure 5:
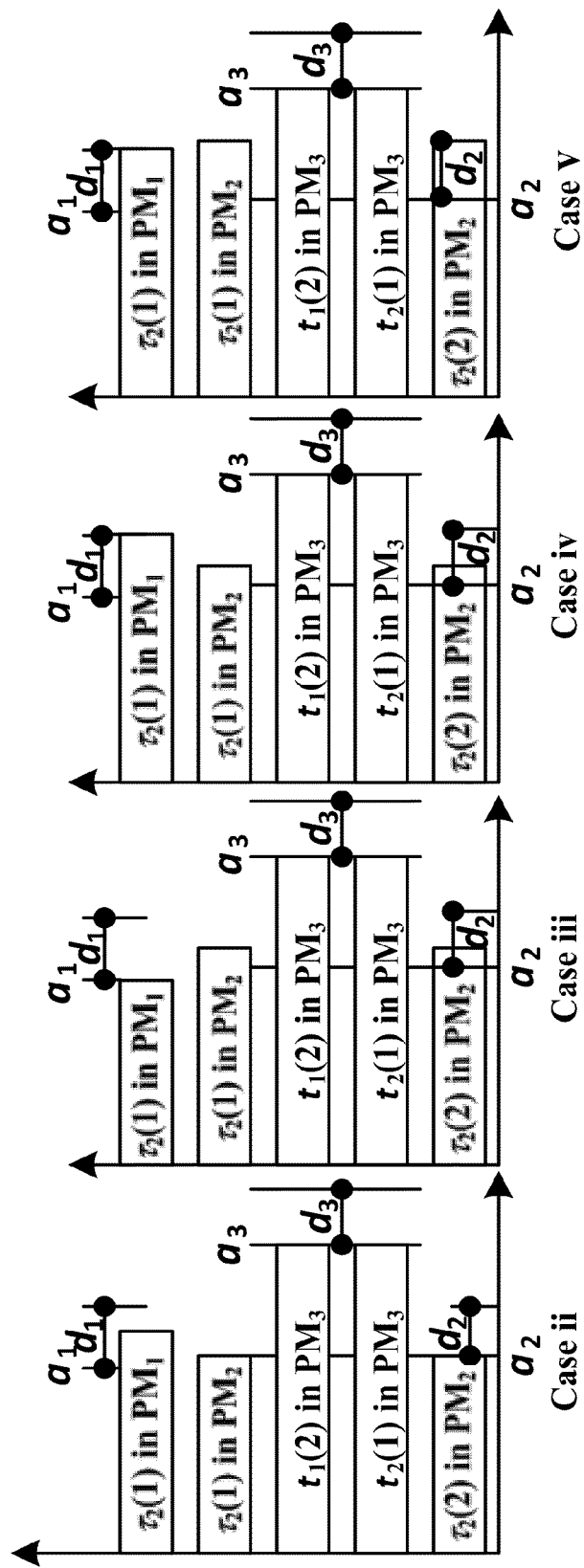
FIG. 5 depicts a wafer sojourn time at different steps in different cases.

This case can be illustrated by the time taken for processing the wafers in a PM shown in FIG. 5. In FIG. 5, let $\tau_d(q)$ in $PM_i$, d, $q \in N_2$, and $i \in N_3$, denote the sojourn time of the d-th wafer visiting $PM_i$ for the q-th time. To make a schedule feasible, $\tau_d(q) \in [\alpha_i, \alpha_i + \delta_i]$ should hold. It follows from FIG. 5 that it is true for every step and every case. Therefore, for all cases, the wafer residency time constraints are satisfied.

Notice that, for Case v, to make $\omega_{01} > 0$, one sets $\omega_{01} = \alpha_3 - (\alpha_1 + \alpha_2 + 2\lambda + \mu + \delta_1 + \delta_2)$. In this case, if $\omega_{01} > \alpha_3 - 4\lambda - 4\mu - \alpha_1 - \delta_1$, one cannot set $\omega_{ij}$'s such that $\forall \omega_{ij} \geq 0$, $\Theta = \zeta = \psi_{11} + \psi_{12}$, and the wafer residency time constraints are satisfied. In other words, a feasible schedule cannot be found and Q=0 is returned to indicate this result.

Figure 6:
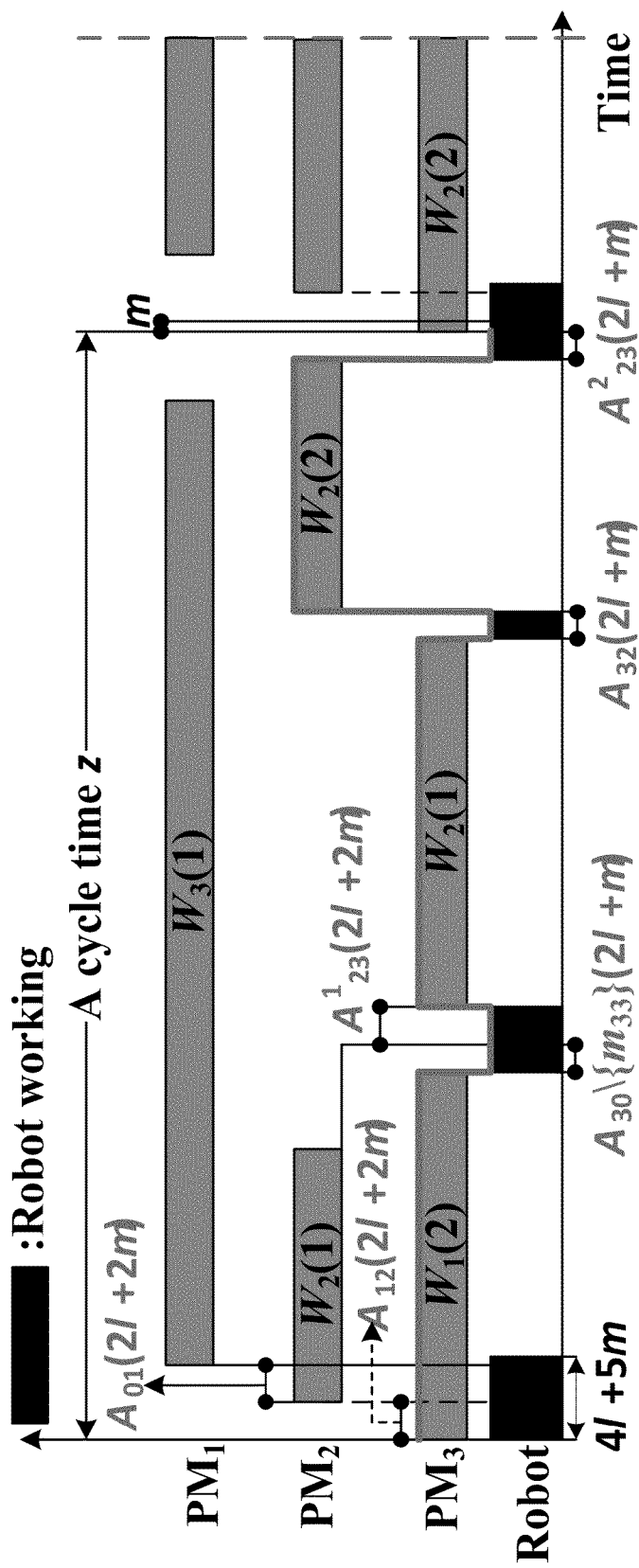
FIG. 6 depicts a Gantt chart of sequence $A^2_{23}A_{12}A_{01}A_{30}A^1_{23}A_{32}$ with $\alpha_2 \leq \alpha_3$.

For robot task sequence Case 2: $A^2_{23}A_{12}A_{01}A_{30}A^1_{23}A_{32}$, the schedule obtained is shown in FIG. 6 and the critical path is found as highlighted. Similar to Case 1, one has $\psi_{22} = \zeta - \psi_{21} = (8\lambda + 5\mu + \alpha_2 + 2\alpha_3) - (12\lambda + 10\mu) = 2\alpha_3 + \alpha_2 - 4\lambda - 5\mu$. For this case, the wafer residency time constraints may be violated for only $W_3(1)$ and $W_2(1)$ that are processed in $PM_1$ and $PM_2$, respectively. Note that $W_3(1)$ in $PM_1$ can be unloaded at not earlier than time instant $\zeta + \mu$. For this case, one presents the following algorithm.

Algorithm 2: If $\Theta = \zeta$ with $\alpha_2 \leq \alpha_3$ and the robot task sequence is $A^2_{23}A_{12}A_{01}A_{30}A^1_{23}A_{32}$, $\omega_{ij}$'s are set as follows to obtain a one-wafer cyclic schedule if it exists.
  i. Q=1.
  ii. If $\alpha_2 + \delta_2 \geq \alpha_3$, $\omega_{12} = 0$
    2.1. If $4\lambda + 4\mu + \alpha_1 \leq \zeta + \mu \leq 4\lambda + 4\mu + \alpha_1 + \delta_1$, $\omega_{01} = 0$, $\omega_{30} = \alpha_3 - 4\lambda - 5\mu$, $\omega^1_{23} = 0$, $\omega_{32} = \alpha_3$, and $\omega^2_{23} = \alpha_2$, go to Step iv;
    2.2. If $4\lambda + 4\mu + \alpha_1 + \delta_1 < \zeta + \mu$, $\omega_{01} = \zeta + \mu - (4\lambda + 4\mu + \alpha_1 + \delta_1)$;
    2.3. If $\omega_{01} > \alpha_3 - 4\lambda - 5\mu$, Q=0 and go to Step iv, otherwise, $\omega_{30} = \alpha_3 - 4\lambda - 5\mu - \omega_{01}$, $\omega^1_{23} = 0$, $\omega_{32} = \alpha_3$, and $\omega^2_{23} = \alpha_2$;
    2.4. Go to Step iv.
  iii. If $\alpha_2 + \delta_2 < \alpha_3$, $\omega_{12} = \alpha_3 - \alpha_2 - \delta_2$
    3.1. If $\omega_{12} + 4\lambda + 4\mu + \alpha_1 \leq \zeta + \mu \leq \omega_{12} + 4\lambda + 4\mu + \alpha_1 + \delta_1$, $\omega_{01} = 0$, $\omega_{30} = \alpha_3 - 4\lambda - 5\mu - \omega_{12}$, $\omega^1_{23} = 0$, $\omega_{32} = \alpha_3$, and $\omega^2_{23} = \alpha_2$, go to Step iv;
    3.2. If $\omega_{12} + 4\lambda + 4\mu + \alpha_1 + \delta_1 < \zeta + \mu$, $\omega_{01} = \zeta + \mu - (\omega_{12} + 4\lambda + 4\mu + \alpha_1 + \delta_1)$;
    3.3. If $\omega_{01} > \alpha_3 - 4\lambda - 5\mu - \omega_{12}$, Q=0 and go to Step iv, otherwise, $\omega_{30} = \alpha_3 - 4\lambda - 5\mu - \omega_{12} - \omega_{01}$, $\omega^1_{23} = 0$, $\omega_{32} = \alpha_3$, and $\omega^2_{23} = \alpha_2$;
    3.4. Go to Step iv.
  iv. Return Q and end.

By Algorithm 2, for 2.1, since $\alpha_i \geq 5(\mu + \lambda)$, one has $\omega_{30} = \alpha_3 - 4\lambda - 5\mu > 0$. For 2.2, as $4\lambda + 4\mu + \alpha_1 + \delta_1 < \zeta + \mu$, $\omega_{01} = \zeta + \mu - (4\lambda + 4\mu + \alpha_1 + \delta_1) > 0$. For 2.3, if Q=1, $\omega_{01} \leq \alpha_3 - 4\lambda - 5\mu$ leading to $\omega_{30} = \alpha_3 - 4\lambda - 5\mu - \omega_{01} \geq 0$. For 3.1, $\omega_{12} = \alpha_3 - \alpha_2 - \delta_2 > 0$ and $\omega_{30} = \alpha_3 - 4\lambda - 5\mu - \omega_{12} = \alpha_2 + \delta_2 - 4\lambda - 5\mu > 0$. For 3.2, $\omega_{01} = \zeta + \mu - (\omega_{12} + 4\lambda + 4\mu + \alpha_1 + \delta_1) > 0$. For 3.3, if Q=1, $\omega_{01} \leq \alpha_3 - 4\lambda - 5\mu - \omega_{12}$, leading to $\omega_{30} = \alpha_3 - 4\lambda - 5\mu - \omega_{12} - \omega_{01} > 0$. Hence, each robot waiting time set by Algorithm 2 is non-negative if Q=1 is returned. Furthermore, one has $\psi_{22} = \omega_{01} + \omega_{12} + \omega_{30} + \omega^2_{23} + \omega_{32} + \omega^1_{23} = 2\alpha_3 + \alpha_2 - 4\lambda - 5\mu$ such that the cycle time is $\Theta = \zeta = \psi_{21} + \psi_{22}$. For this case, one has the following feasibility result, which can be similarly proved as Theorem 1 is.

Theorem 2: Assume that: 1) the cycle time of the system is $\Theta = \zeta$ with $\alpha_2 \leq \alpha_3$, 2) the robot task sequence is $A^2_{23}A_{12}A_{01}A_{30}A^1_{23}A_{32}$, and 3) the robot waiting time is set by Algorithm 2 with Q=1 being returned. Then, the obtained one-wafer cyclic schedule is feasible.

Similar to Case 1, when Q=0 is returned, a feasible schedule cannot be found. By robot task sequence Case 3: $A^2_{23}A_{12}A_{30}A_{01}A^1_{23}A_{32}$, after unloading a wafer from $PM_3$ to the loadlocks, the robot does not come to $PM_2$ for unloading completed $W_2(1)$ to deliver it to $PM_3$. Instead, it unloads a wafer from the loadlocks and loads it into $PM_1$. By doing so, the critical path is changed, leading to $\Theta > \zeta$. This implies that, by $A^2_{23}A_{12}A_{30}A_{01}A^1_{23}A_{32}$, a schedule with $\Theta = \zeta$ does not exist.

Figure 7:
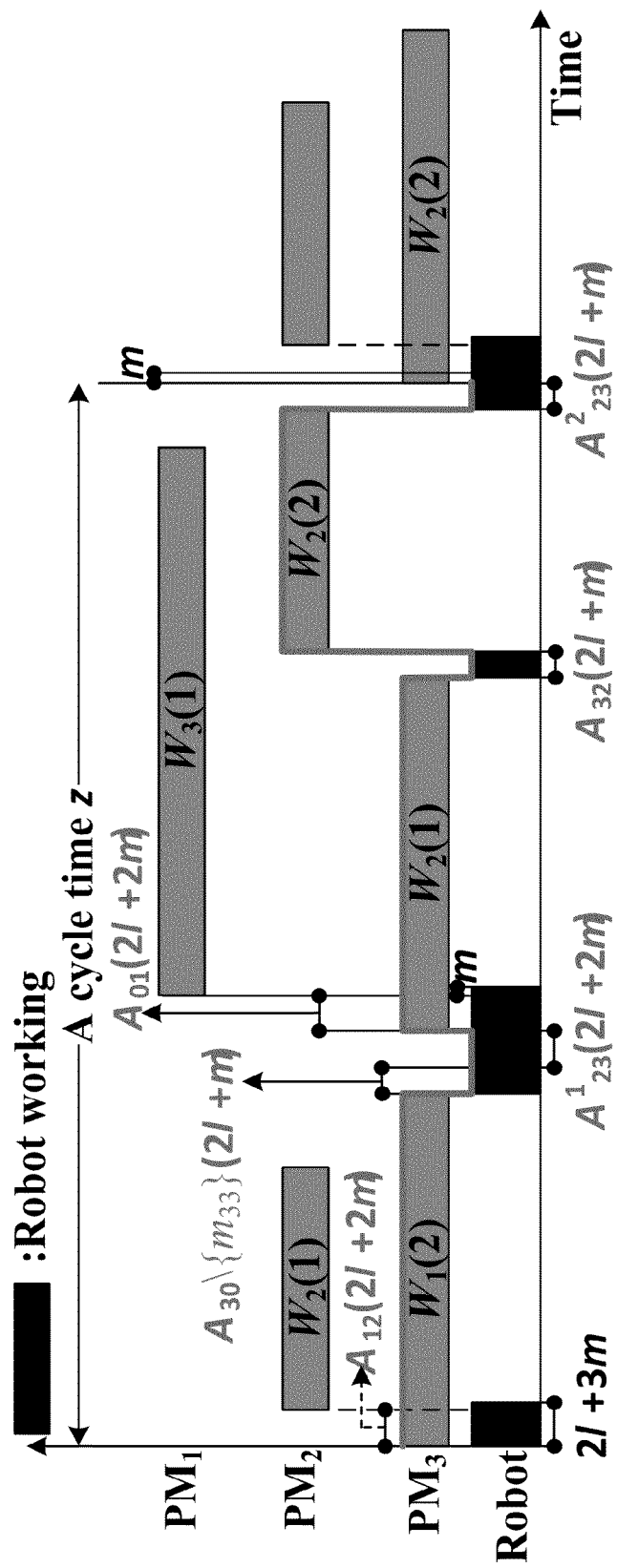
FIG. 7 depicts a Gantt chart of sequence $A^2_{23}A_{12}A_{30}A^1_{23}A_{01}A_{32}$ with $\alpha_2 \leq \alpha_3$.

Now, consider robot task sequence Case 4: $A^2_{23}A_{12}A_{30}A^1_{23}A_{01}A_{32}$ For this case, the obtained schedule is depicted in FIG. 7, and the critical path is found and highlighted. From (4), one has $\psi_{42} = \zeta - \psi_{41} = 2\alpha_3 + \alpha_2 - 4\lambda - 6\mu$. In this case, it follows from FIG. 7 that the wafer residency time constraints may be violated for only $W_3(1)$ and $W_2(1)$ that are processed in $PM_1$ and $PM_2$, respectively. As shown in FIG. 7, $W_3(1)$ is unloaded at time $\zeta + \mu$. One has the following algorithm to schedule the system.

Algorithm 3: If $\Theta = \zeta$ with $\alpha_2 \leq \alpha_3$ and the robot scheduling strategy $A^2_{23}A_{12}A_{30}A^1_{23}A_{01}A_{32}$ is applied, $\omega_{ij}$'s are set as follows to obtain a one-wafer cyclic schedule if it exists.
  i. Q=1.
  ii. If $\alpha_2 + \delta_2 \geq \alpha_3$, $\omega_{12} = 0$, $\omega_{30} = \alpha_3 - 2\lambda - 3\mu$, and $\omega^1_{23} = 0$
    2.1. If $\alpha_3 + 6\lambda + 5\mu + \alpha_1 \leq \zeta + \mu \leq \alpha_3 + 6\lambda + 5\mu + \alpha_1 + \delta_1$, $\omega_{01} = 0$, $\omega_{32} = \alpha_3 - 2\lambda - 3\mu$, $\omega^2_{23} = \alpha_2$, and go to Step iv;
    2.2. If $\alpha_3 + 6\lambda + 5\mu + \alpha_1 + \delta_1 < \zeta + \mu$, $\omega_{01} = \zeta + \mu - (\alpha_3 + 6\lambda + 5\mu + \alpha_1 + \delta_1)$;
    2.3. If $\omega_{01} > \alpha_3 - 2\lambda - 3\mu$, Q=0, otherwise, $\omega_{32} = \alpha_3 - 2\lambda - 3\mu - \omega_{01}$ and $\omega^2_{23} = \alpha_2$;
    2.4. Go to Step iv.
  iii. If $\alpha_2 + \delta_2 < \alpha_3$, $\omega_{12} = \alpha_3 - \alpha_2 - \delta_2$
    3.1. If $\omega_{12} > \alpha_3 - 2\lambda - 3\mu$, Q=0 and go to Step iv;
    3.2. Otherwise, $\omega_{30} = \alpha_3 - 2\lambda - 3\mu - \omega_{12}$ and $\omega^1_{23} = 0$
      3.2.1. If $\alpha_3 + 6\lambda + 5\mu + \alpha_1 \leq \zeta + \mu \leq \alpha_3 + 6\lambda + 5\mu + \alpha_1 + \delta_1$, $\omega_{01} = 0$, $\omega_{32} = \alpha_3 - 2\lambda - 3\mu$, $\omega^2_{23} = \alpha_2$, and go to Step iv;
      3.2.2. If $\alpha_3 + 6\lambda + 5\mu + \alpha_1 + \delta_1 < \zeta + \mu$, $\omega_{01} = \zeta + \mu - (\alpha_3 + 6\lambda + 5\mu + \alpha_1 + \delta_1)$;
      3.2.3. If $\omega_{01} > \alpha_3 - 2\lambda - 3\mu$, Q=0, otherwise, $\omega_{32} = \alpha_3 - 2\lambda - 3\mu - \omega_{01}$ and $\omega^2_{23} = \alpha_2$;
      3.2.4. Go to Step iv;
  iv. Return Q and end.

By Algorithm 3, for Case ii, one has $\omega_{30} = \alpha_3 - 2\lambda - 3\mu > 0$. By Statement 2.1, $\omega_{32} = \alpha_3 - 2\lambda - 3\mu > 0$ and by Statement 2.2, since $\alpha_3 + 6\lambda + 5\mu + \alpha_1 + \delta_1 < \zeta + \mu$, one has $\omega_{01} = \zeta + \mu - (\alpha_3 + 6\lambda + 5\mu + \alpha_1 + \delta_1) > 0$. By Statement 2.3, if Q=1, one has $\omega_{01} \leq \alpha_3 - 2\lambda - 3\mu$, leading to $\omega_{32} = \alpha_3 - 2\lambda - 3\mu - \omega_{01} \geq 0$. For Case iii, as $\alpha_2 + \delta_2 < \alpha_3$, one has $\omega_{12} = \alpha_3 - \alpha_2 - \delta_2 > 0$. By Statements 3.1-3.2, if Q=1, one has $\omega_{12} \leq \alpha_3 - 2\lambda - 3\mu$, leading to $\omega_{30} = \alpha_3 - 2\lambda - 3\mu - \omega_{12} \geq 0$. Since the robot waiting time set by Statements 3.2.1-3.2.3 are identical to that set by Statements 2.1-2.3, each robot waiting time set by Algorithm 3 is non-negative. Furthermore, one has $\psi_{42} = \omega_{01} + \omega_{12} + \omega_{30} + \omega^2_{23} + \omega_{32} + \omega^1_{23} = 2\alpha_3 + \alpha_2 - 4\lambda - 6\mu$ such that $\Theta = \zeta = \psi_{41} + \psi_{42}$ holds. For schedule feasibility, one has the following theorem.

Theorem 3: Assume that: 1) the cycle time of the system is $\Theta = \zeta$ with $\alpha_2 \leq \alpha_3$, 2) the robot task sequence is $A^2_{23}A_{12}A_{30}A^1_{23}A_{01}A_{32}$, and 3) the robot waiting time is set by Algorithm 3 with Q=1 being returned. Then, the obtained one-wafer cyclic schedule is feasible.

Figure 8:
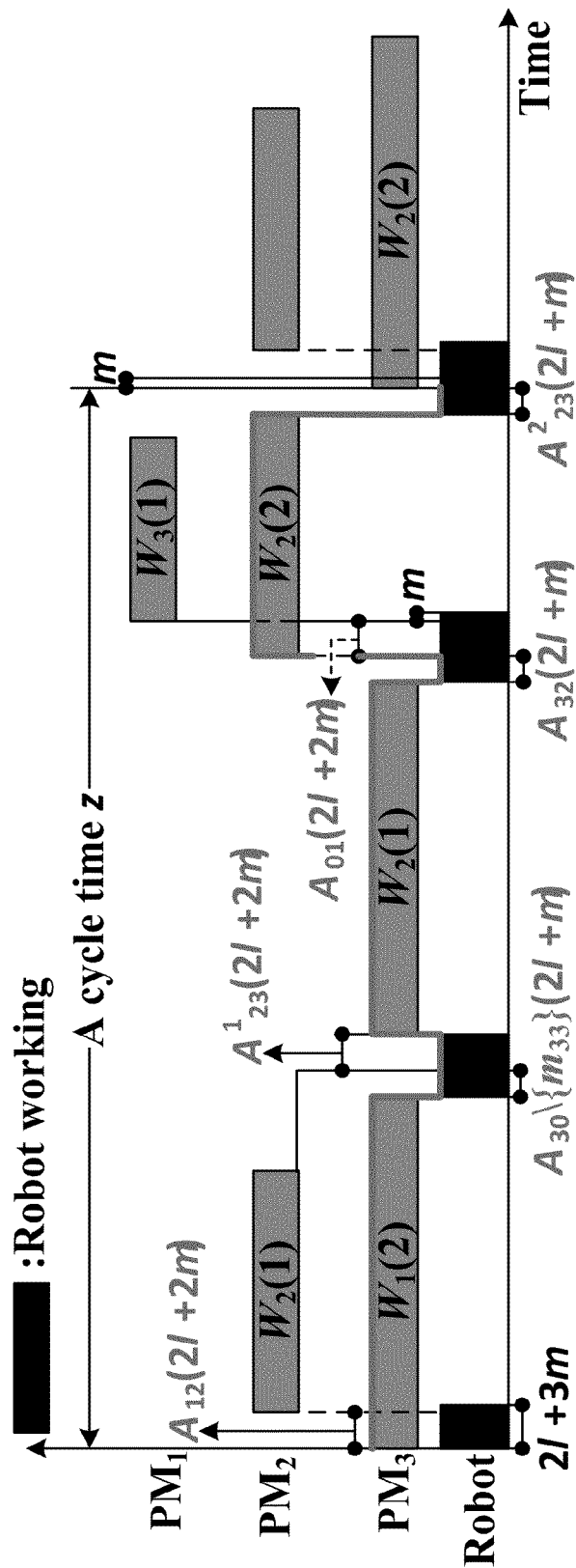
FIG. 8 depicts a Gantt chart of sequence $A^2_{23}A_{12}A_{30}A^1_{23}A_{32}A_{01}$ with $\alpha_2 \leq \alpha_3$.

For the robot scheduling strategy $A^2_{23}A_{12}A_{30}A^1_{23}A_{32}A_{01}$, a schedule can be obtained as shown in FIG. 8. Similarly, from (5) one has $\psi_{52} = \zeta - \psi_{51} = 2\alpha_3 + \alpha_2 - 4\lambda - 6\mu$. In this case, it follows from the schedule in FIG. 8 that the wafer residency time constraints may be violated for only $W_3(1)$ and $W_2(1)$ that are processed in $PM_1$ and $PM_2$, respectively. With the fact that $W_3(1)$ is unloaded at time instant $\zeta+\mu$, one presents the following algorithm to schedule the system.

Algorithm 4: If $\Theta=\zeta$ with $\alpha_2 \leq \alpha_3$ and the robot scheduling strategy $A^2_{23}A_{12}A_{30}A^1_{23}A_{32}A_{01}$ is applied, $\omega_{ij}$'s are set as follows to obtain a one-wafer cyclic schedule if it exists.

i. Set Q=1
ii. If $\alpha_2+\delta_2 \geq \alpha_3$, $\omega_{12}=0$, $\omega_{30}=\alpha_3-2\lambda-3\mu$, $\omega^1_{23}=0$, and $\omega_{32}=\alpha_3$
  2.1. If $2\alpha_3+8\lambda+6\mu+\alpha_1 \leq \zeta+\mu \leq 2\alpha_3+8\lambda+6\mu+\alpha_1+\delta_1$, $\omega_{01}=0$, $\omega^2_{23}=\alpha_2-2\lambda-3\mu$, and go to Step iv;
  2.2. If $2\alpha_3+8\lambda+6\mu+\alpha_1+\delta_1 < \zeta+\mu$, $\omega_{01}=\zeta+\mu-(2\alpha_3+8\lambda+6\mu+\alpha_1+\delta_1)$;
  2.3. If $\omega_{01} > \alpha_3-2\lambda-3\mu$, Q=0, otherwise, $\omega^2_{23}=\alpha_2-2\lambda-3\mu-\omega_{01}$;
  2.4. Go to Step iv.
iii. If $\alpha_2+\delta_2 < \alpha_3$, $\omega_{12}=\alpha_3-\alpha_2-\delta_2$
  3.1. If $\omega_{12} > \alpha_3-2\lambda-3\mu$, Q=0 and go to Step iv;
  3.2. Otherwise, $\omega_{30}=\alpha_3-2\lambda-3\mu-\omega_{12}$, $\omega^1_{23}=0$, and $\omega_{32}=\alpha_3$
    3.2.1. If $2\alpha_3+8\lambda+6\mu+\alpha_1 \leq \zeta+\mu \leq 2\alpha_3+8\lambda+6\mu+\alpha_1+\delta_1$, $\omega_{01}=0$, $\omega^2_{23}=\alpha_2-2\lambda-3\mu$, and go to Step iv;
    3.2.2. If $2\alpha_3+8\lambda+6\mu+\alpha_1+\delta_1 < \zeta+\mu$, $\omega_{01}=\zeta+\mu-(2\alpha_3+8\lambda+6\mu+\alpha_1+\delta_1)$;
    3.2.3. If $\omega_{01} > \alpha_3-2\lambda-3\mu$, Q=0, otherwise $\omega^2_{23}=\alpha_2-2\lambda-3\mu-\omega_{01}$;
    3.2.4. Go to Step iv.
iv. Return Q and end.

By Algorithm 4, for Case ii, one has $\omega_{30}=\alpha_3-2\lambda-3\mu>0$. By Statement 2.1, $\omega^2_{23}=\alpha_3-2\lambda-3\mu>0$ and by Statement 2.2, with $2\alpha_3+8\lambda+6\mu+\alpha_1+\delta_1 < \zeta+\mu$, one has $\omega_{01}=\zeta+\mu-(2\alpha_3+8\lambda+6\mu+\alpha_1+\delta_1)>0$. Then, by Statement 2.3, if Q=1, $\omega_{01} \leq \alpha_3-2\lambda-3\mu$ such that $\omega^2_{23}=\alpha_2-2\lambda-3\mu-\omega_{01} \geq 0$. For Case iii, since $\alpha_2+\delta_2<\alpha_3$, $\omega_{12}=\alpha_3-\alpha_2-\delta_2>0$. Then, by Statements 3.1-3.2, if Q=1, $\omega_{12} \leq \alpha_3-2\lambda-3\mu$ such that $\omega_{30}=\alpha_3-2\lambda-3\mu-\omega_{12} \geq 0$. Notice that the robot waiting time set via Statements 3.2.1-3.2.3 are identical to that set via Statements 2.1-2.3. Therefore, every robot waiting time set by Algorithm 4 is non-negative. Further, one has $\psi_{52}=\omega_{01}+\omega_{12}+\omega_{30}+\omega^2_{23}+\omega_{23}+\omega^1_{23}=2\alpha_3+\alpha_2-4\lambda-6\mu$, or one has $\Theta=\zeta=\psi_{51}+\psi_{52}$. For this case, one has the following theorem.

Theorem 4: Assume that: 1) the cycle time of system is $\Theta=\zeta$ with $\alpha_2 \leq \alpha_3$, 2) the robot scheduling strategy $A^2_{23}A_{12}A_{30}A^1_{23}A_{32}A_{01}$ is applied, and 3) the robot waiting time is set by Algorithm 4 with Q=1 being returned. Then, the obtained one-wafer cyclic schedule is feasible.

Up to now, for the case that $\Theta=\zeta$ and $\alpha_2 \leq \alpha_3$, one has analyzed the scheduling problem by using the five different robot scheduling strategies and presented the scheduling method if a schedule exists. Next, one analyzes the scheduling problem for the case that $\Theta=\zeta$ and $\alpha_2 > \alpha_3$.

B. $\Theta=\zeta$ and $\alpha_2 > \alpha_3$

When $\alpha_2 > \alpha_3$, one has $\zeta=8\lambda+5\mu+2\alpha_2+\alpha_3$. For strategy $A^2_{23}A_{01}A_{12}A_{30}A^1_{23}A_{32}$, it follows from the above discussion that, to make $\Theta=\zeta$, $\alpha_1+\alpha_2+2\lambda+\mu \leq \alpha_3$ must hold, leading to $\alpha_2 < \alpha_3$, which contradicts to the assumption that $\alpha_2 > \alpha_3$. This implies that if $\Theta=\zeta$ and $\alpha_2 > \alpha_3$, no schedule can be found by using this strategy.

Figure 9:
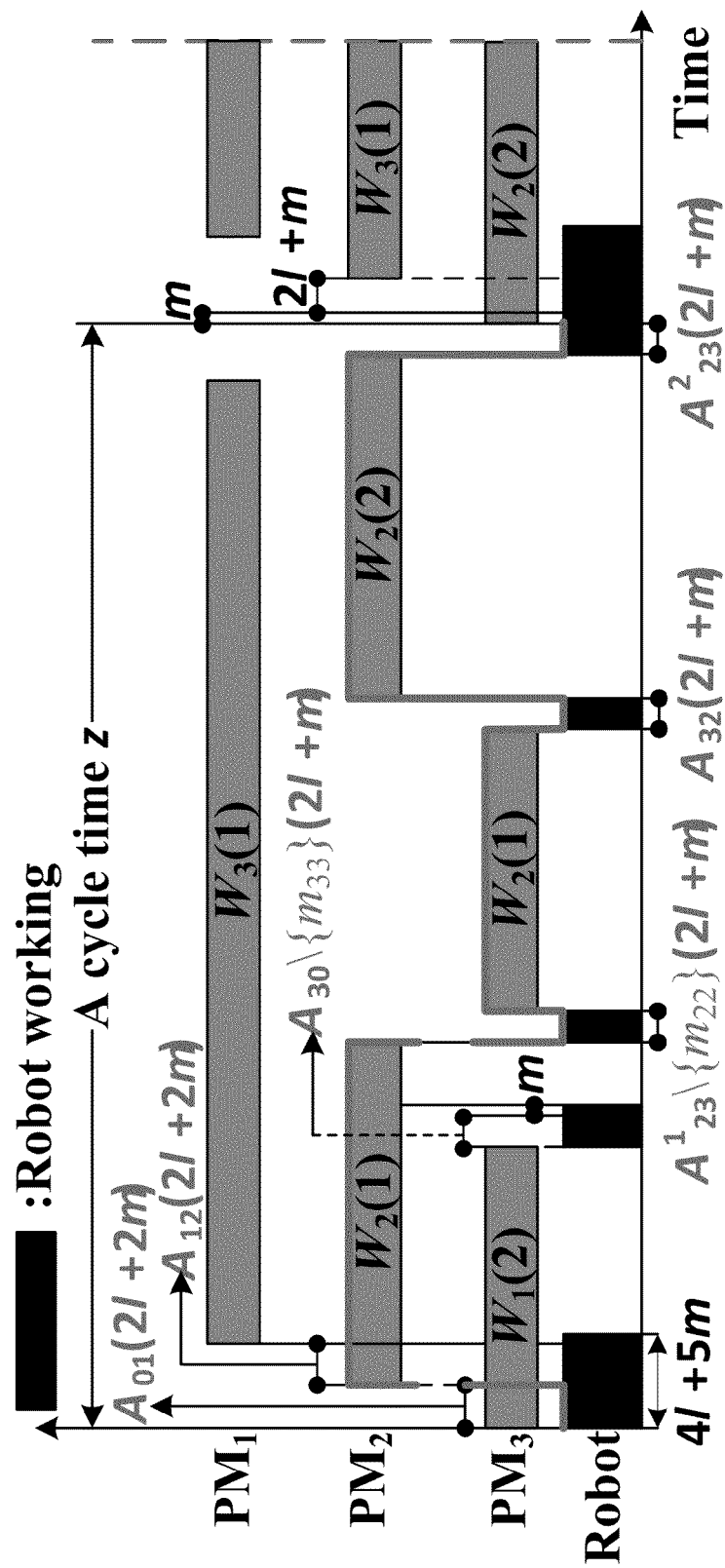
FIG. 9 depicts a Gantt chart of sequence $A^2_{23}A_{12}A_{01}A_{30}A^1_{23}A_{32}$ with $\alpha_2 > \alpha_3$.

Now one examines strategy $A^2_{23}A_{12}A_{01}A_{30}A^1_{23}A_{32}$. In this case, a schedule can be obtained as shown in FIG. 9. From (2), one has $\psi_{22}=\zeta-\psi_{21}=(8\lambda+5\mu+2\alpha_2+\alpha_3)-(12\lambda+10\mu)=2\alpha_2+\alpha_3-4\lambda-5\mu$. It follows from the schedule shown in FIG. 9 that $W_1(2)$ being processed in $PM_3$ is unloaded immediately after it is processed since $\alpha_3 \geq 5\lambda+5\mu>2\times(2\lambda+2\mu)+\mu$ is assumed. Also, $W_2(1)$, $W_2(1)$, and $W_2(2)$ that are processed in $PM_2$, $PM_3$, and $PM_2$, respectively, are unloaded as soon as they are completed. Hence, the wafer residency time constraints can be violated for only $W_3(1)$ that is processed in $PM_1$. Note that $W_3(1)$ in $PM_1$ is unloaded at time instant $\zeta+\mu$. Then, one presents the following algorithm to find a schedule.

Algorithm 5: If $\Theta=\zeta$, $\alpha_2>\alpha_3$, and the robot scheduling strategy $A^2_{23}A_{12}A_{01}A_{30}A^1_{23}A_{32}$ is applied, $\omega_{ij}$'s are set as follows to obtain a one-wafer cyclic schedule if it exists.

i. Q=1.
ii. If $4\lambda+4\mu+\alpha_1 \leq \zeta+\mu \leq 4\lambda+4\mu+\alpha_1+\delta_1$
  2.1. $\omega_{01}0$, $\omega_{30}=\alpha_3-4\lambda-5\mu$, $\omega^1_{23}=\alpha_2-\alpha_3$, $\omega_{32}=\alpha_3$, and $\omega^2_{23}=\alpha_2$, go to Step iv.
iii. If $4\lambda+4\mu+\alpha_1+\delta_1 < \zeta+\mu$
  3.1. $\omega_{01}=\zeta+\mu-(4\lambda+4\mu+\alpha_1+\delta_1)$;
  3.2. If $\omega_{01} > \alpha_3-4\lambda-5\mu$, Q=0 and go to Step iv;
  3.3. Otherwise, $\omega_{30}=\alpha_3-4\lambda-5\mu-\omega_{01}$, $\omega^1_{23}=\alpha_2-\alpha_3$, $\omega_{32}=\alpha_3$, $\omega^2_{23}=\alpha_2$, and go to Step iv.
iv. Return Q and end.

In Algorithm 5, by Statement 2.1, $\omega_{30}=\alpha_3-4\lambda-5\mu>0$ and $\omega^1_{23}=\alpha_2-\alpha_3>0$ hold. By Statements 3.1-3.3, as $4\lambda+4\mu+\alpha_1+\delta_1<\zeta+\mu$, one has $\omega_{01}=\zeta+\mu-(4\lambda+4\mu+\alpha_1+\delta_1)>0$. Then, if Q=1, $\omega_{01} \leq \alpha_3-4\lambda-5\mu$, one has $\omega_{30}=\alpha_3-4\lambda-5\mu-\omega_{01} \geq 0$. Hence, the robot waiting time set by Algorithm 5 is non-negative. Furthermore, one has $\psi_{22}=\omega_{01}+\omega_{12}+\omega_{30}+\omega^2_{23}+\omega_{32}+\omega^1_{23}=2\alpha_3+\alpha_2-4\lambda-5\mu$ such that $\Theta=\zeta=\psi_{21}+\psi_{22}$. For the obtained schedule, one has the following theorem.

Figure 10:
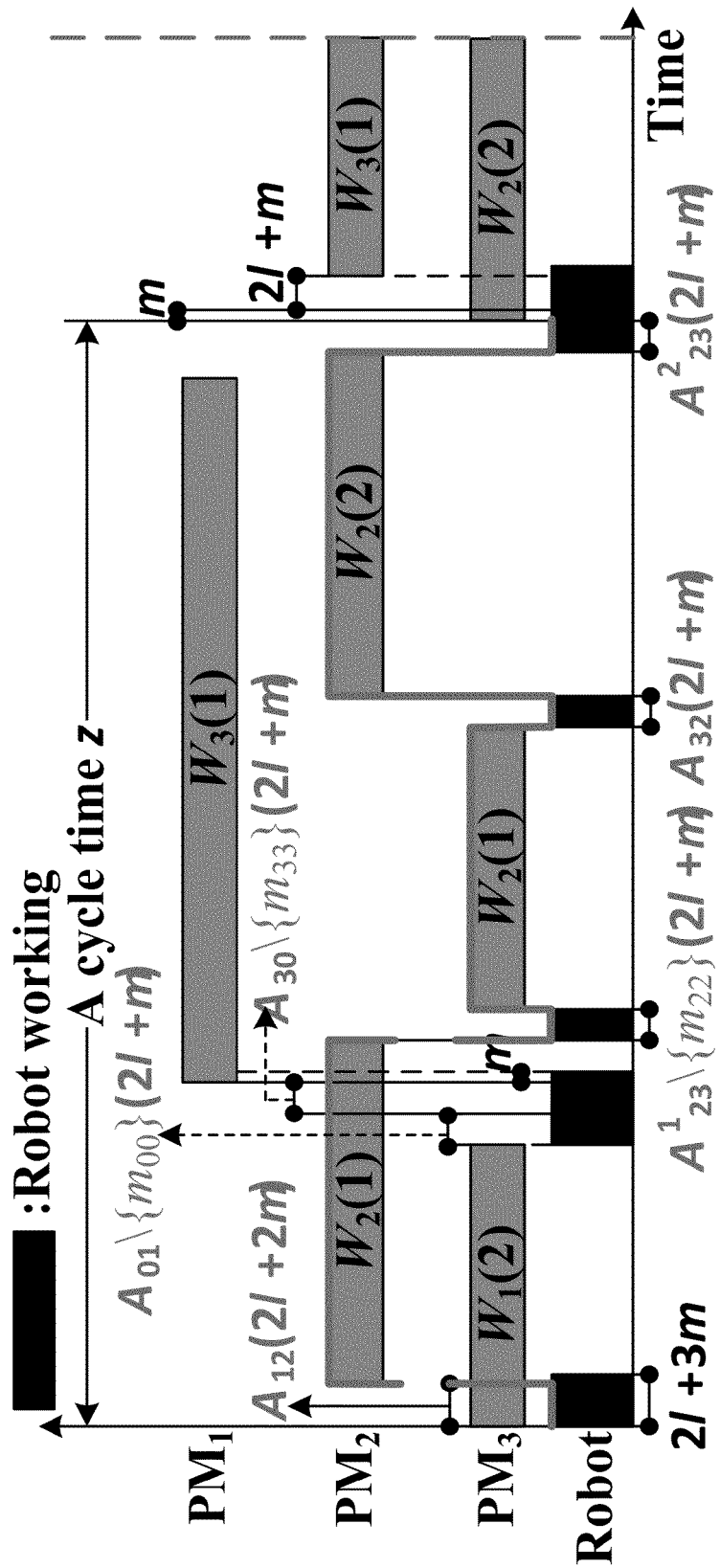
FIG. 10 depicts a Gantt chart of sequence $A^2_{23}A_{12}A_{30}A_{01}A^1_{23}A_{32}$ with $\alpha_2 > \alpha_3$.

Theorem 5: Assume that: 1) the cycle time of the system is $\Theta=\zeta$ with $\alpha_2>\alpha_3$, 2) robot scheduling strategy $A^2_{23}A_{12}A_{01}A_{30}A^1_{23}A_{32}$ is applied, and 3) the robot waiting time is set by Algorithm 5 with Q=1 being returned. Then, the obtained one-wafer cyclic schedule is feasible For strategy $A^2_{23}A_{12}A_{30}A_{01}A^1_{23}A_{32}$, a schedule can be obtained as shown in FIG. 10. From it, after unloading a wafer from $PM_3$ to the loadlocks, the robot unloads a raw wafer from the loadlocks and loads it into $PM_1$. By doing so, a schedule with $\Theta=\zeta$ can be obtained and $\alpha_2 \geq \alpha_3+2\lambda+\mu$ must hold. This implies that $W_2(1)$ in $PM_2$ is not completed before the robot comes to $PM_2$ for unloading it. For this case, from (3), one has $\psi_{32}=\zeta-\psi_{31}=2\lambda_2+\alpha_3-4\lambda-4\mu$. Also, by this strategy, the wafer residency time constraints can be violated for only $W_3(1)$ being processed in $PM_1$. One presents the following algorithm to find a schedule.

Algorithm 6: If $\Theta=\zeta$, $\alpha_2 \geq \alpha_3+2\lambda+\mu$, and the robot scheduling strategy $A^2_{23}A_{12}A_{30}A_{01}A^1_{23}A_{32}$ is applied, $\omega_{ij}$'s are set as follows to obtain a one-wafer cyclic schedule if it exists.

i. Q=1.
ii. If $4\lambda+2\mu+\alpha_3+\alpha_1 \leq \zeta+\mu \leq 4\lambda+2\mu+\alpha_3+\alpha_1+\delta_1$
  2.1. $\omega_{12}=0$, $\omega_{30}=\alpha_3-2\lambda-3\mu$, $\omega_{01}=0$, $\omega^1_{23}=\alpha_2-\alpha_3-2\lambda-\mu$, $\omega_{32}=\alpha_3$, $\omega^2_{23}=\alpha_2$, and go to Step iv.
iii. If $4\lambda+2\mu+\alpha_3+\alpha_1+\delta_1<\zeta+\mu$
  3.1. $\omega_{12}=0$, $\omega_{30}=\alpha_3-2\lambda-3\mu$, and $\omega_{01}=\zeta+\mu-(4\lambda+2\mu+\alpha_3+\alpha_1+\delta_1)$;
  3.2. If $\omega_{01}>\alpha_2-\alpha_3-2\lambda-\mu$, Q=0, and go to Step iv;
  3.3. Otherwise, $\omega^1_{23}=\alpha_2-\alpha_3-2\lambda-\mu-\omega_{01}$, $\omega_{32}=\alpha_3$, $\omega^2_{23}=\alpha_2$, and go to Step iv.
iv. Return Q and end.

In Algorithm 6, for Case ii, $\omega_{30}=\alpha_3-2\lambda-3\mu>0$ and $\omega^1_{23}=\alpha_2-\alpha_3-2\lambda-\mu>0$. For Case iii, $\omega_{30}=\alpha_3-2\lambda-3\mu>0$. As $4\lambda+2\mu+\alpha_3+\alpha_1+\delta_1<\zeta+\mu$, one has $\omega_{01}=\zeta+\mu-(4\lambda+2\mu+\alpha_3+\alpha_1+\delta_1)>0$. By Statements 3.2-3.3, if Q=1, $\omega_{01} \leq \alpha_2-\alpha_3-2\lambda-\mu$, then, one has $\omega^1_{23}=\alpha_2-\alpha_3-2\mu-\mu-\omega_{01} \geq 0$. Hence, the robot waiting time set by Algorithm 6 is non-negative. Furthermore, one has $\psi_{32}=\omega_{01}+\omega_{12}+\omega^2_{23}+\omega_{32}+\omega^1_{23}+2\lambda\alpha_2+\alpha_3-4\lambda-4\mu$ such that $\Theta 32\ \zeta=\psi_{31}+\psi_{32}$. For the obtained schedule, one has the following theorem.

Theorem 6: Assume that 1) the cycle time of the system is $\Theta=\zeta$ with $\alpha_2 \geq \alpha_3+2\lambda+\mu$, 2) the robot scheduling strategy $A^2_{23}A_{12}A_{30}A_{01}A^1_{23}A_{32}$ is applied, and 3) the robot waiting time is set by Algorithm 6 with Q=1 being returned. Then, the obtained one-wafer cyclic schedule is feasible.

Figure 11:
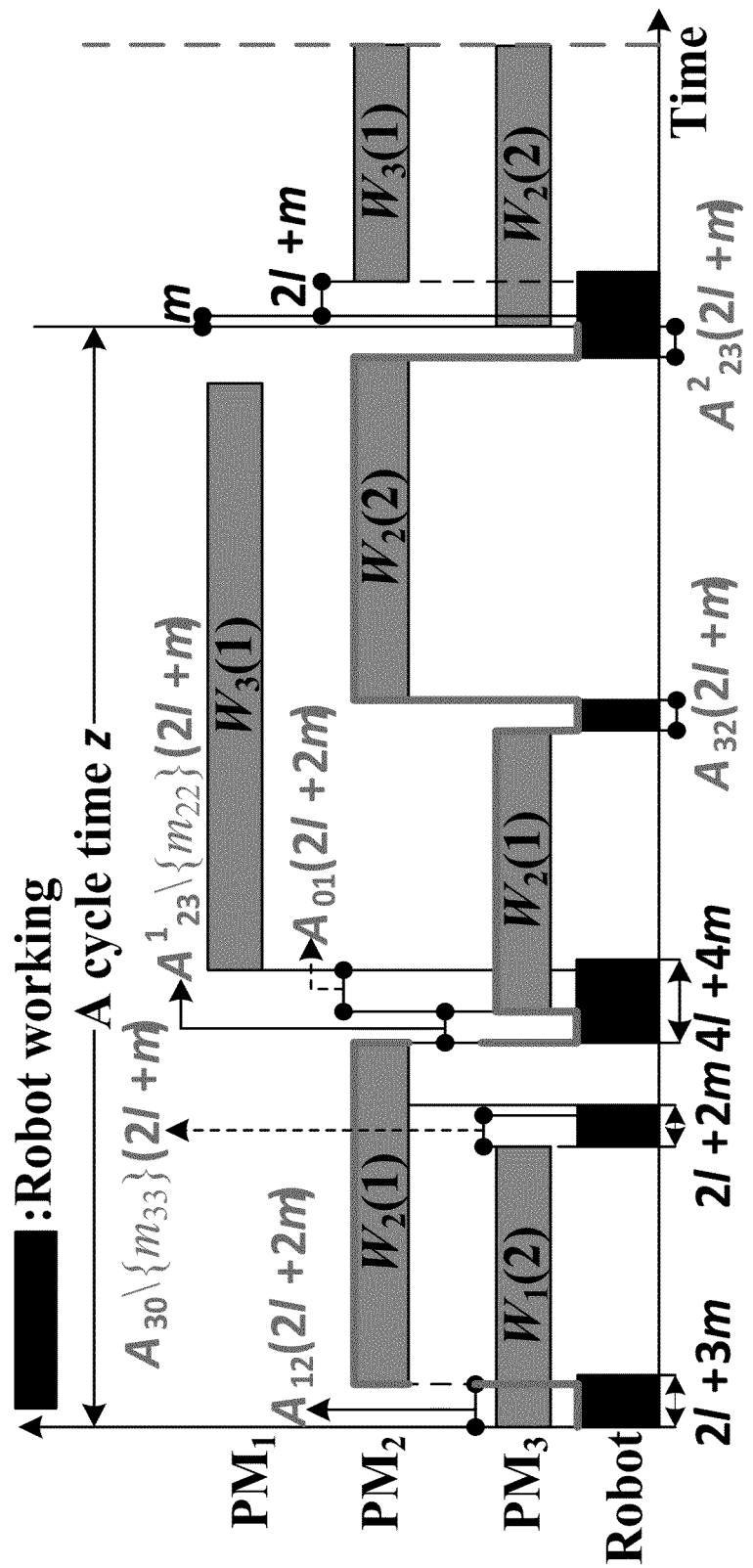
FIG. 11 depicts a Gantt chart of sequence $A^2_{23}A_{12}A_{30}A^1_{23}A_{01}A_{32}$ with $\alpha_2 > \alpha_3$.

For strategy $A^2_{23}A_{12}A_{30}A^1_{23}A_{01}A_{32}$, a schedule can be obtained as shown in FIG. 11. In this case, from (4), one has $\psi_{42}=\zeta-\psi_{41}=2\alpha_2+\alpha_3-4\lambda-6\mu$. It follows from it that the wafer residency time constraints may be violated for only $W_3(1)$ being processed in $PM_1$. One presents the following algorithm to set the robot waiting time.

Algorithm 7: If $\Theta=\zeta$, $\alpha_2>\alpha_3$, and robot scheduling strategy $A^2_{23}A_{12}A_{30}A^1_{23}A_{01}A_{32}$ is applied, $\omega_{ij}$'s are set as follows to obtain a one-wafer cyclic schedule if it exists.

i. Q=1.
 ii. If $\alpha_2+6\lambda+5\mu+\alpha_1\leq\zeta+\mu\leq\alpha_2+6\lambda+5\mu+\alpha_1+\delta_1$
  2.1. $\omega_{12}=0$, $\omega_{30}=\alpha_3-2\lambda-3\mu$, $\omega^1_{23}=\alpha_2-\alpha_3$, $\omega_{01}=0$, $\omega_{32}=\alpha_3-2\lambda-3\mu$, $\omega^2_{23}=\alpha_2$, and go to Step iv.
 iii. If $\alpha_2+6\lambda+5\mu+\alpha_1+\delta_1<\zeta+\mu$
  3.1. $\omega_{12}=0$, $\omega_{30}=\alpha_3-2\lambda-3\mu$, $\omega^1_{23}=\alpha_2-\alpha_3$, and $\omega_{01}=\zeta+\mu-(\alpha_2+6\lambda+5\mu+\alpha_1+\delta_1)$;
  3.2. If $\omega_{01}>\alpha_3-2\lambda-3\mu$, Q=0, and go to Step iv;
  3.3. Otherwise, $\omega_{32}=\alpha_3-2\lambda-3\mu-\omega_{01}$, $\omega^2_{23}=\alpha_2$, and go to Step iv.
 iv. Return Q and end.

In Algorithm 7, for Case ii, $\omega_{30}=\alpha_3-2\lambda-3\mu>0$, $\omega^1_{23}=\alpha_2-\alpha_3>0$, and $\omega_{32}=\alpha_3-2\lambda-3\mu>0$. For Case iii, $\omega_{30}=\alpha_3-2\lambda-3\mu>0$ and $\omega^1_{23}=\alpha_2-\alpha_3>0$. As $\alpha_2+6\lambda+5\mu+\alpha_1+\delta_1<\zeta+\mu$, one has $\omega_{01}=\zeta+\mu-(\alpha_2+6\lambda+5\mu+\alpha_1+\delta_1)>0$. By Statements 3.2-3.3, if Q=1, $\omega_{01}\leq\alpha_3-2\lambda-3\mu$, leading to $\omega_{32}=\alpha_3-2\lambda-3\mu-\omega_{01}\geq0$. Hence, the robot waiting time set by Algorithm 6 is non-negative. Furthermore, one has $\psi_{42}=\omega_{01}+\omega_{12}+\omega_{30}+\omega^2_{23}+\omega_{32}+\omega^1_{23}=2\alpha_2+\alpha_3-4\lambda-6\mu$ such that $\Theta=\zeta=\psi_{41}+\psi_{42}$. For this case, one has the following theorem.

Theorem 7: Assume that: 1) the cycle time of the system is $\Theta=\zeta$ with $\alpha_2>\alpha_3$, 2) robot scheduling strategy $A^2_{23}A_{12}A_{30}A^1_{23}A_{01}A_{32}$ is applied, and 3) robot waiting time is set by Algorithm 7 with Q=1 being returned. Then, the obtained one-wafer cyclic schedule is feasible.

Figure 12:
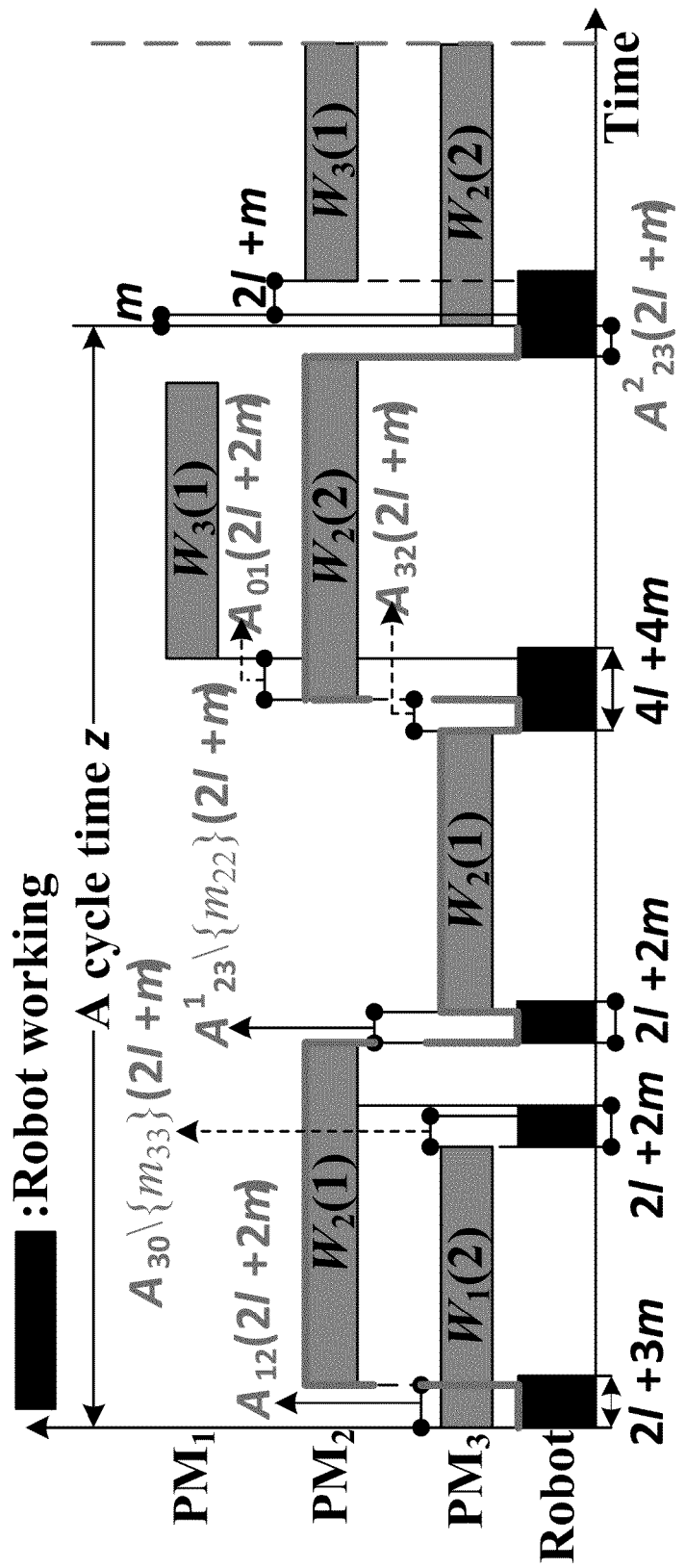
FIG. 12 depicts a Gantt chart of sequence $A^2_{23}A_{12}A_{30}A^1_{23}A_{32}A_{01}$ with $\alpha_2 > \alpha_3$.

For strategy $A^2_{23}A_{12}A_{30}A^1_{23}A_{32}A_{01}$, a schedule can be obtained as depicted in FIG. 12. From (5), one has $\psi_{52}=\zeta-\psi_{51}=2\alpha_2+\alpha_3-4\lambda-6\mu$. In this case, the wafer residency time constraints can be violated for only $W_3(1)$ being processed in $PM_1$. The following algorithm is used to set the robot waiting time.

Algorithm 8: If $\Theta=\zeta$, $\alpha_2>\alpha_3$, and robot scheduling strategy $A^2_{23}A_{12}A_{30}A^1_{23}A_{32}A_{01}$ is applied, $\omega_{ij}$'s are set as follows to obtain a one-wafer cyclic schedule if it exists.

i. Q=1.
 ii. If $\alpha_2+\alpha_3+8\lambda+6\mu+\alpha_1\leq\zeta+\mu\leq\alpha_2+\alpha_3+8\lambda+6\mu+\alpha_1+\delta_1$
  2.1. $\omega_1=0$, $\omega_{30}=\alpha_3-2\lambda-3\mu$, $\omega^1_{23}=\alpha_2-\alpha_3$, $\omega_{32}=\alpha_3$, $\omega_{01}=0$, $\omega^2_{23}=\alpha_2-2\lambda-3\mu$, and go to Step iv.
 iii. If $\alpha_2+\alpha_3+8\lambda+6\mu+\alpha_1+\delta_1<\zeta+\mu$
  3.1. $\omega_{12}=0$, $\omega_{30}=\alpha_3-2\lambda-3\mu$, $\omega^1_{23}=\alpha_2-\alpha_3$, $\omega_{32}=\alpha_3$, and $\omega_{01}=\zeta+\mu-(\alpha_2+\alpha_3+8\lambda+6\mu+\alpha_1+\delta_1)$;
  3.2. If $\omega_{01}>\alpha_2-2\lambda-3\mu$, Q=0 and go to Step iv;
  3.3. Otherwise, $\omega^2_{23}=\alpha_2-2\lambda-3\mu-\omega_{01}$ and go to Step iv.
 iv. Return Q and end.

In Algorithm 8, for Case ii, $\omega_{30}=\alpha_3-2\lambda-3\mu>0$, $\omega^1_{23}=\alpha_2-\alpha_3>0$, and $\omega^2_{23}=\alpha_2-2\lambda-3\mu>0$. For Case iii, $\omega_{30}=\alpha_3-2\lambda-3\mu>0$ and $\omega^1_{23}=\alpha_2-\alpha_3>0$. As $\alpha_2+\alpha_3+8\lambda+6\mu+\alpha_1+\delta_1<\zeta+\mu$, one has $\omega_{01}=\zeta+\mu-(\alpha_2+\alpha_3+8\lambda+6\mu+\alpha_1+\delta_1)>0$. By Statements 3.2-3.3, if Q=1, $\omega_{01}\leq\alpha_2-2\lambda-3\mu$ and one thus has $\omega^2_{23}=\alpha_2-2\lambda-3\mu-\omega_{01}\geq0$. Hence, every robot waiting time set by Algorithm 8 is non-negative. Furthermore, one has $\psi_{52}=\omega_{01}+\omega_{12}+\omega_{30}+\omega^2_{23}+\omega_{32}+\omega^1_{23}=2\alpha_2+\alpha_3-4\lambda-6\mu$ such that $\Theta=\zeta=\psi_{51}+\psi_{52}$. For this case, one has the following theorem.

Theorem 8: Assume that: 1) the cycle time of the system is $\Theta=\zeta$ with $\alpha_2>\alpha_3$, 2) robot scheduling strategy $A^2_{23}A_{12}A_{30}A^1_{23}A_{32}A_{01}$ is applied, and 3) the robot waiting time is set by Algorithm 8 with Q=1 being returned. Then, the obtained one-wafer cyclic schedule is feasible.

Up to now, for the case that $\Theta=\zeta$, one analyzes the existence of a schedule by examining the five robot scheduling strategies. If there is a schedule, algorithms are given to find a feasible one-wafer cyclic schedule. By $\Theta=\zeta$, it means that the revisiting process decides the cycle time of the system. In some cases, the wafer processing time in $PM_1$ decides the cycle time of the system. One discusses such cases next.

C. $\Theta>\zeta$

It follows from the discussion in Section A that when $\Theta>\zeta$ there are two possible robot scheduling strategies, i.e., Cases 6 and 7, or $A^2_{23}A_{30}A_{12}A_{01}A^1_{23}A_{32}$ and $A^2_{23}A_{12}A_{01}A_{30}A^1_{23}A_{32}$. For Case 6, from Section A, after the robot loads a wafer into $PM_2$, the robot should go to the loadlocks immediately for unloading a raw wafer there. After unloading a wafer from the loadlocks, it moves to $PM_1$ and loads the wafer into $PM_1$, or $A_{01}$ is performed with $2\lambda+2\mu$ time units being taken. Then, $A^1_{23}\backslash\{m_{22}\}$, $A_{32}$, $A^2_{23}$, and $A_{30}$ are performed sequentially. After $A_{30}$ is performed, the robot comes to $PM_1$ for performing $A_{12}$. Since the cycle time of the system is dominated by the wafer processing time in $PM_1$, when the robot arrives at $PM_1$, the wafer being processed in $PM_1$ is not completed yet. Thus, to complete a wafer at $PM_1$, the following activities should be executed in a sequential way: (Loading a wafer into $PM_2(\lambda)\rightarrow$moving to the loadlock $(\mu)\rightarrow$unloading a wafer from the loadlock $(\lambda)\rightarrow$moving to $PM_1(\mu)\rightarrow$loading it to $PM_1(\lambda)\rightarrow$processing at $PM_1(\alpha_1)\rightarrow$unloading a wafer from $PM_1(\lambda)\rightarrow$moving to $PM_2(\mu)\rightarrow$loading a wafer into $PM_2(\lambda)$ again). The time taken for completing a wafer at $PM_1$ is $\alpha_1+4\lambda+3\mu$, or the cycle time of the system is $\Theta=\alpha_1+4\lambda+3\mu>\zeta$.

Figure 13:
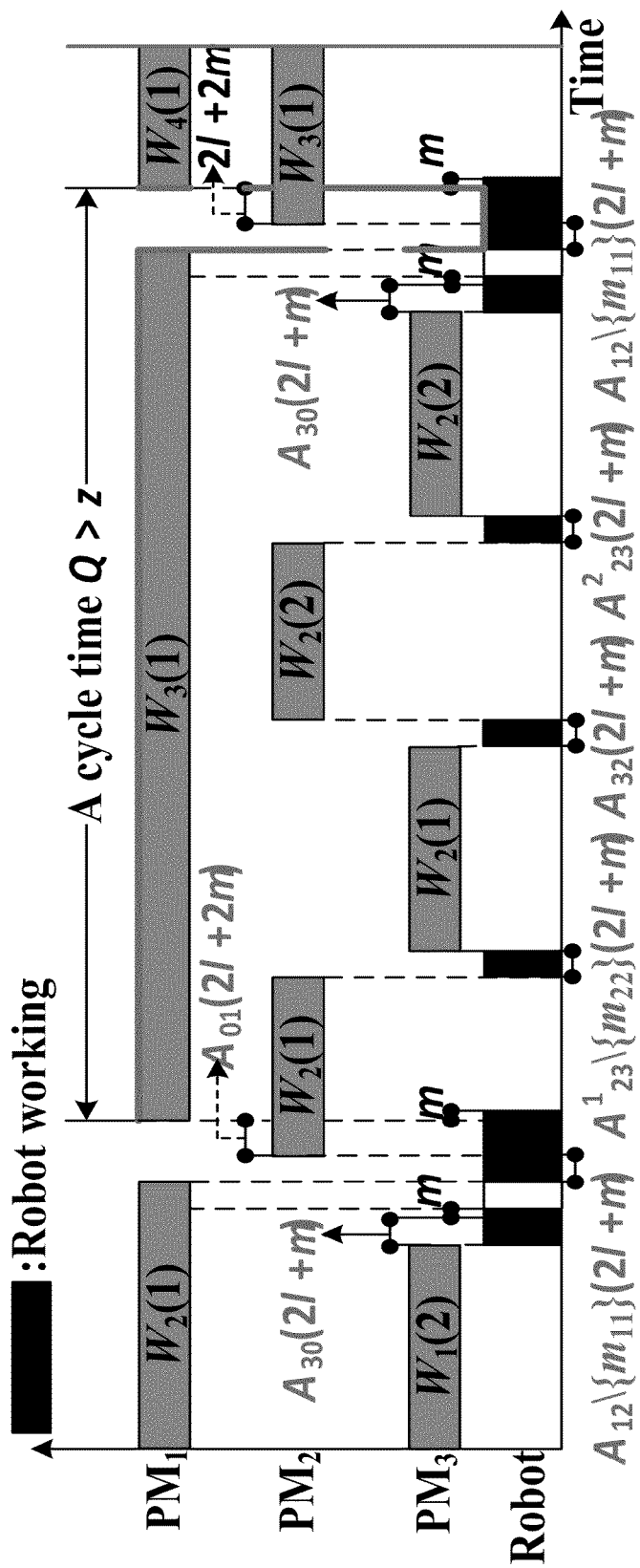
FIG. 13 depicts a Gantt chart of sequence $A^2_{23}A_{30}A_{12}A_{01}A^1_{23}A_{32}$.

Based on the above analysis, by applying $A^2_{23}A_{30}A_{12}A_{01}A^1_{23}A_{32}$, a schedule can be obtained as shown in FIG. 13. From FIG. 13, one has $\alpha_1>6\lambda+3\mu+2(\alpha_2+\alpha_3)$. For this schedule, all the wafers are unloaded immediately from a PM after they are completed. Therefore, the wafer residency time constraints are clearly satisfied. Furthermore, from (6), one has $\psi_{62}=\Theta-\psi_{61}=\alpha_1+4\lambda+3\mu-(12\lambda+9\mu)=\alpha_1-8\lambda-6\mu$. The following algorithm is present to set the robot waiting time for this schedule.

Algorithm 9: If $\Theta>\zeta$, $\alpha_1\geq6\lambda+3\mu+2(\alpha_2+\alpha_3)$, and robot scheduling strategy $A^2_{23}A_{30}A_{12}A_{01}A^1_{23}A_{32}$ is applied, $\omega_{ij}$'s are set as follows to obtain a one-wafer cyclic schedule if it exists.

1) $\omega_{30}=\alpha_3$ and $\omega_{01}=0$;
 2) $\omega^1_{23}=\alpha_2-2\lambda-3\mu$;
 3) $\omega_{32}=\alpha_3$, $\omega^2_{23}=\alpha_2$;
 4) $\omega_{12}=\alpha_1-6\lambda-3\mu-2(\alpha_2+\alpha_3)$.

By assumption that $\alpha_2\geq5\lambda+5\mu$, one has $\omega^1_{23}=\alpha_2-2\lambda-3\mu>0$. As $\alpha_1\geq6\lambda+3\mu+2(\alpha_2+\alpha_3)$, $\omega_{12}=\alpha_1-6\lambda-3\mu-2(\alpha_2+\alpha_3)\geq0$. Hence, the robot waiting time set by Algorithm 9 is non-negative. Furthermore, one has $\psi_{62}=\omega_{01}+\omega_{12}+\omega_{30}+\omega^2_{23}+\omega_{32}+\omega^1_{23}=\alpha_1-8\lambda-6\mu$ such that $\Theta=\psi_{51}+\psi_{52}$. As discussed above, the wafer residency time constraints are always met. Hence, for this schedule, one has the following theorem immediately.

Theorem 9: Assume that: 1) the cycle time of the system is $\Theta>\zeta$ and $\alpha_1\geq6\lambda+3\mu+2(\alpha_2+\alpha_3)$, 2) robot scheduling strategy $A^2_{23}A_{30}A_{12}A_{01}A^1_{23}A_{32}$ is applied, and 3) the robot waiting time is set by Algorithm 9. Then, the obtained one-wafer cyclic schedule is feasible.

Figure 14:
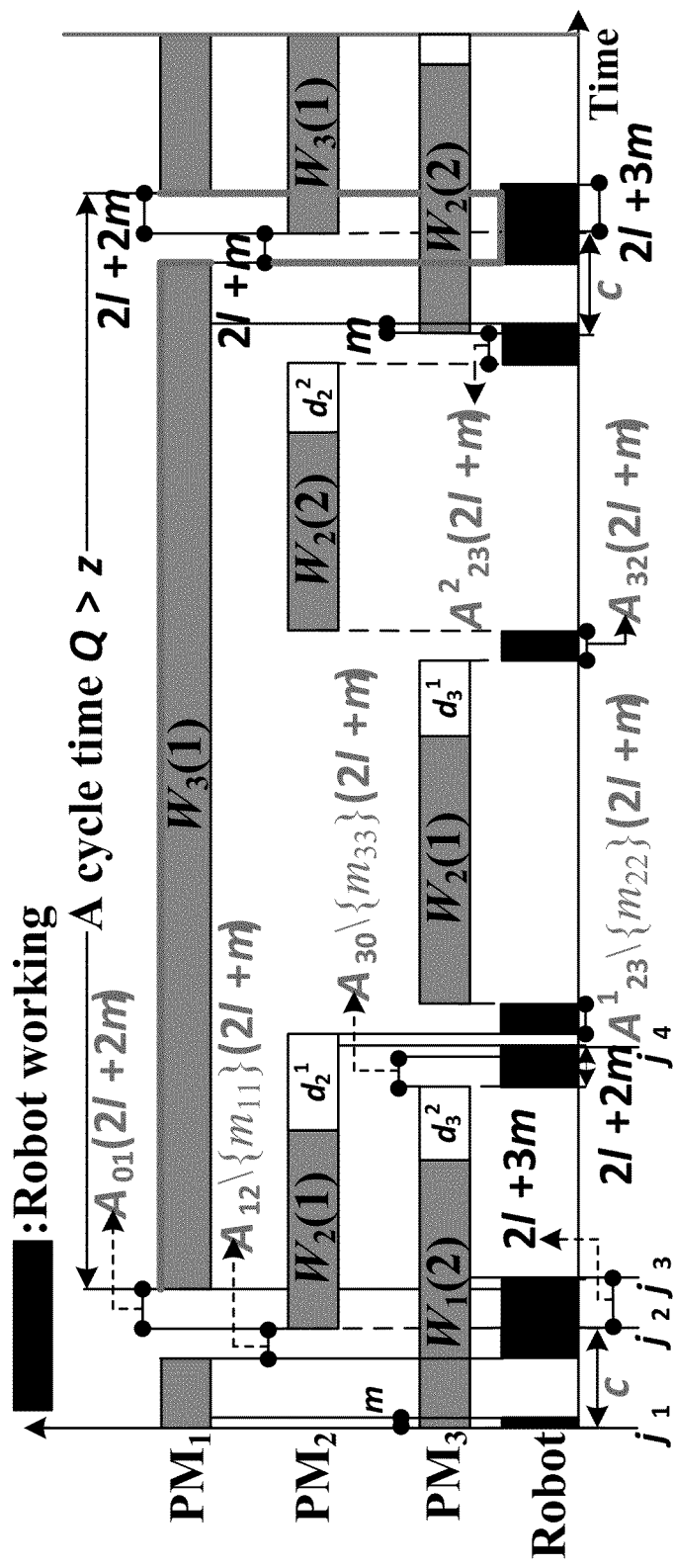
FIG. 14 depicts a Gantt chart of sequence $A^2_{23}A_{12}A_{01}A_{30}A^1_{23}A_{32}$.

For case 7: $A^2_{23}A_{12}A_{01}A_{30}A^1_{23}A_{32}$, to make the wafer residency time constraints satisfied, after $A^2_{23}$ is performed, the robot may wait for some time and then perform $A_{12}$. Further, by such a strategy, a wafer may stay in a PM for some time after its completion and the schedule obtained is depicted in FIG. 14. Let $\delta_m{}^n\in[0, \delta_m]$ be the time for which the m-th wafer with its n-th visiting of a PM stays in the PM after processed. For this case, one also has $\Theta=\alpha_1+4\lambda+3\mu>\zeta$. From (7), one has $\psi_{72}=\Theta-\psi_{71}=\alpha_1+4\lambda+\mu-(12\lambda+10\mu)=\alpha_1-8\lambda-7\mu$.

To make the schedule feasible, $\delta_m''$ must fall within $[0, \delta_m]$. However, $\delta_m''$ cannot be decided independently and a method is necessary to do so. Let $\phi_1$ and $\phi_2$ be time instants when the execution of $A^2_{23}$ and $A_{12}$ ends, and $\chi=\phi_2-\phi_1$. After $A^2_{23}$ is performed, the robot may wait for some time and then performs $A_{12}$, which takes $2\lambda+2\mu$ time units. Thus, one has Case A: $\chi\geq 2\lambda+2\mu$. For this case, after $A_{12}$ is performed, it is followed by $A_{01}$ (which takes $2\lambda+2\mu$ time units) and then $A_{30}$. Hence, after performing $A_{01}$, the robot comes to $PM_3$ for unloading $W_1(2)$ by performing $m_{13}$ ($\mu$ time units). Let $\phi_3$ be time instant when the execution of $m_{13}$ ends. Then, one has Case B: $\phi_3-\phi_1=\chi+2\lambda+3\mu\leq \alpha_3+\delta_3^2$. By performing $A_{30}\backslash\{m_{13}\}$ ($2\lambda+\mu$), $W_1(2)$ completed in $PM_3$ is loaded into the loadlocks. Then, the robot comes to $PM_2$ for unloading $W_2(1)$ by performing $m_{02}$ ($\mu$ time units). Let $\phi_4$ be time instant when the execution of $m_{02}$ ends. Then, one has Case C: $\phi_4-\phi_1=\alpha_3+\delta_3^2+2\lambda+2\mu\leq\chi+\alpha_2+\delta_2^1$. By assumption, the wafer processing time in $PM_1$ dominates the cycle time of the system. From FIG. 14, one has Case D: $\chi+(\alpha_2+\delta_2^1)+(\alpha_3+\delta_3^1)+(\alpha_2+\delta_2^2)+3(2\lambda+\mu)=\alpha_1+4\lambda+3\mu$. Hence, to obtain a feasible schedule, the following linear program is proposed to determine $\chi$, $\delta_2^1$, $\delta_2^2$, $\delta_3^1$, and $\delta_3^2$.

$$\text{Min } Z = \chi + \delta_3^1 + \delta_3^2 + \delta_2^1 + \delta_2^2 \qquad (8)$$

$$s.t. \begin{cases} \chi \geq 2\lambda + 2\mu \\ \chi - \delta_3^2 \leq \alpha_3 - 2\lambda - 3\mu \\ -\chi + \delta_3^2 - \delta_2^1 \leq \alpha_2 - \alpha_3 - 2\lambda - 2\mu \\ \chi + \delta_3^1 + \delta_2^2 + \delta_2^2 = \alpha_1 - 2\alpha_2 - \alpha_3 - 2\lambda \\ \delta_3^2 \leq \delta_3 \\ \delta_3^1 \leq \delta_3 \\ \delta_2^1 \leq \delta_2 \\ \delta_2^2 \leq \delta_2 \\ \chi, \delta_3^1, \delta_3^2, \delta_2^1, \delta_2^2 \geq 0 \end{cases}$$

Since the variables can be any real number, this linear programing problem can be efficiently solved by a commercial solver. It implies that the system does not satisfy the wafer residency time constraints by adopting strategy $A^2_{23}A_{12}A_{01}A_{30}A^1_{23}A_{32}$ if there is no solution for such a Z. Otherwise, the following algorithm is presented to schedule the system.

Algorithm 10: If $\Theta>\zeta$ and robot scheduling strategy $A^2_{23}A_{12}A_{01}A_{30}A^1_{23}A_{32}$ is applied, $\omega_{ij}$'s are set as follows to obtain a one-wafer cyclic schedule if it exists.

1) Determine, $\chi$m $\delta_2^1$, $\delta_2^2$, $\delta_3^1$, and $\delta_3^2$ by solving Problem (8);
2) $\omega_{12}=\chi-2\lambda-2\mu$, $\omega_{01}=0$, $\omega_{30}=\alpha_3+\delta_3^2-2\lambda-3\mu-\chi$;
3) $\omega^1_{23}=\chi+\alpha_2+\delta_2^1=\alpha_3-\delta_3^2-2\lambda-2\mu$, $\omega_{32}=\alpha_3+\delta_3^1$, and $\omega^2_{23}=\alpha_2+\delta_2^2$.

By Algorithm 10, since $\psi\in[2\lambda+2\mu, \alpha_3+\delta_3^2-2\lambda-3\mu]$, one has $\omega_{12}=\chi-2\lambda-2\mu\geq 0$ and $\omega_{30}=\alpha_3+\delta_3^2-2\lambda-3\mu-\chi\geq 0$. From (8) one has $\chi+\alpha_2+\delta_2^1\geq\alpha_3+\delta_3^2+2\lambda+2\mu$, leading to $\omega^1_{23}=\chi+\alpha_2+\delta_2^1-\alpha_3-\delta_3^2-2\lambda-2\mu\geq 0$. Hence, the robot waiting time set by Algorithm 10 is non-negative. Further, one has $\omega_{01}+\omega_{12}+\omega_{30}+\omega^2_{23}+\omega_{32}+\omega^1_{23}=\delta_2^1+\delta_2^2+\delta_3^1+\chi+2\alpha_2+\alpha_3-6\lambda-7\mu=\alpha_1-8\lambda-7\mu=\psi_{72}$ such that $\Theta=\psi_{71}+\psi_{72}$. For this case, one has the following theorem.

Theorem 10: Assume that: 1) the cycle time of the system is $\Theta>\zeta$, 2) robot scheduling strategy $A^2_{23}A_{12}A_{01}A_{30}A^1_{23}A_{32}$ is applied, and 3) the robot waiting time is set by Algorithm 10. Then, the obtained one-wafer cyclic schedule is feasible.

Proof: It is obviously and is omitted.

Up to now, one has presented the schedulability analysis by applying the seven robot scheduling strategies and conditions are given to check the schedulability. If schedulable, algorithms are proposed to obtain a feasible schedule by setting the robot waiting time. The proposed methods are efficient and practically applicable. Next, one proves the optimality of the obtained schedule.

Theorem 11: A schedule obtained by Algorithms 1-10 is optimal in terms of cycle time.

Proof: For a schedule obtained by Algorithms 1-8, one has $\Theta=\zeta=8\lambda+5\mu+\alpha_2+\alpha_3+\text{Max}\{\alpha_2, \alpha_3\}$. Since $\zeta$ is the cycle time of an optimal schedule for the revisiting process $(PM_2, PM_3)^2$, if the system is scheduled such that $\Theta<\zeta$, at least one of the wafers that are processed in $PM_2$ or $PM_3$ cannot be completed. In other words, it is infeasible. For a schedule obtained by Algorithms 9-10, one has $\Theta=4\lambda+3\mu+\alpha_1>\zeta$. Hence, if the system is scheduled such that $\Theta\leq\zeta$, the wafer that is processed in $PM_1$ cannot be completed within $\Theta$, and the schedule is infeasible. Therefore, a schedule found by Algorithms 1-10 is optimal in terms of cycle time.

It is important to schedule a cluster tool to maximize the productivity. By Theorem 11, such a goal is realized.

C. Illustrative Examples

This section uses examples to show the application of the proposed method. For all examples, the wafer flow pattern is $(PM_1, (PM_2, PM_3)^2)$.

Example 1

The wafer processing time at Steps 1-3 are $\alpha_1=120$ s, $\alpha_2=75$ s, $\alpha_3=60$ s, respectively. After being processed, a wafer at Steps 1-3 can stay there for at most 20 s, 25 s, and 25 s, or $\delta_1=20$ s, $\delta_2=25$ s, and $\delta_3=25$ s. The robot task time is $\mu=1$ s and $\lambda=3$ s.

For this example, as $\alpha_2>\alpha_3$, one has $\zeta=8\lambda+5\mu+\alpha_2+\alpha_3+\text{Max}\{\alpha_2, \alpha_3\}=239$ s$>\alpha_1+4\lambda+3\mu=135$ s. Thus, $\Theta=\zeta=239$ s. With $\alpha_2>\alpha_3$, one needs to examine Algorithms 5-8 only. One has $\alpha_2+6\lambda+5\mu+\alpha_1+\delta_1=75+18+5+120+20=238$ s$<\zeta+\mu=239+1=240$ s. Thus, Case iii of Algorithm 7 with robot scheduling strategy $A^2_{23}A_{12}A_{30}A^1_{23}A_{01}A_{32}$ is applied. According to Case iii of Algorithm 7, the robot waiting time is set as $\omega_{12}=0$, $\omega_{30}=\alpha_3-2\lambda-3\mu=60-6-3=51$ s, $\omega^1_{23}=\alpha_2-\alpha_3=75-60=15$ s, $\omega_{01}=\zeta+\mu-(\alpha_2+6\lambda+5\mu+\alpha_1+\delta_1)=240-238=2$ s, $\omega_{32}=\alpha_3-2\lambda-3\mu-\omega_{01}=60-6-3-2=49$ s, and $\omega^2_{23}=75$ s. By this setting, one has $\psi_{42}=\omega_{01}+\omega_{12}+\omega_{30}+\omega^2_{23}+\omega_{32}+\omega^1_{23}=192$ s$=\zeta-\psi_{41}=\zeta-(12\lambda+11\mu)=239-47=192$ s.

Example 2

The wafer processing time at Steps 1-3 is changed to $\alpha_1=100$ s, $\alpha_2=60$ s, and $\alpha_3=75$ s, respectively.

For this example, as $\alpha_2<\alpha_3$, one has $\zeta=8\lambda+5\mu+\alpha_2+\alpha_3+\text{Max}\{\alpha_2, \alpha_3\}=239$ s$>\alpha_1+4\lambda+3\mu=115$ s. Thus, $\Theta=\zeta=239$ s. With $\alpha_2<\alpha_3$, only Algorithms 1-4 are possible for scheduling it. Since $\alpha_1+\alpha_2+2\lambda+\mu=100+60+6+1=167$ s$>\alpha_3=75$ s, Algorithm 1 is excluded. Also, as $\alpha_2+\delta_2=60+25>\alpha_3=75$, only Cases ii of Theorems 2-4 needs to be examined. By Case ii of Algorithm 2, one has $4\lambda+4\mu+\alpha_1+\delta_1=12+4+100+20=136$ s$<\zeta+\mu=240$ s. However, in this case, $\omega_{01}=\zeta+\mu-(4\lambda+4\mu+\alpha_1+\delta_1)=104$ s $>\alpha_3-4\lambda-5\mu=75-12-5=58$ s such that Q=0 is returned. Hence, Algorithm 2 is excluded. By Case ii of Algorithm 4, one has $2\alpha_3+8\lambda+6\mu+\alpha_1=2\times75+24+6+$ $100=280>\zeta+\mu=240$ s. Then, if strategy $A^2_{23}A_{12}A_{30}A^1_{23}A_{32}A_{01}$ is applied, it results in a schedule such that $\Theta>\zeta$. Thus, Algorithm 4 is excluded. Now, examine Case ii of Algorithm 3, one has $\alpha_3+6\lambda+5\mu+\alpha_1+\delta_1=75+18+5+100+20=218$ s$<\zeta+\mu=240$ s, or Statement 2.2 is satisfied. Furthermore, $\omega_{01}=\zeta+\mu-(\alpha_3+6\lambda+5\mu+\alpha_1+\delta_1)=22$ s$<\alpha_3-2\lambda-3\mu=75-6-3=66$ s such that Q=1 is returned. This implies that Case ii of Algorithm 3 with robot scheduling strategy $A^2_{23}A_{12}A_{30}A^1_{23}A_{01}A_{32}$ is applicable. With it, one sets $\omega_{01}=22$, $\omega_{12}=0$, $\omega_{30}=\alpha_3-2\lambda-3\mu=75-6-3=66$ s, $\omega^1_{23}=0$, $\omega_{32}=\alpha_3-2\lambda-3\mu-\omega_{01}=75-6-3-22=44$ s, and $\omega^2_{23}=\alpha_2=60$ s such that a feasible schedule is obtained.

Example 3

The wafer processing time at Steps 1-3 is changed to $\alpha_1=240$ s, $\alpha_2=75$s, and $\alpha_3=60$s, respectively.

For this example, one has $\zeta+8\lambda+5\mu+\alpha_2+\alpha_3+\text{Max}\{\alpha_2,\alpha_3\}=239$ s$<\alpha_1+4\lambda+3\mu=255$ s. Thus, $\Theta=255$ s, i.e., the wafer processing time in $PM_1$ decides the cycle time of the system. As $\alpha_1=240<6\lambda+3\mu+2(\alpha_2+\alpha_3)=291$, hence, Algorithm 9 cannot be applied, or strategy $A^2_{23}A_{30}A_{12}A_{01}A^1_{23}A_{32}$ is excluded. For strategy $A^2_{23}A_{12}A_{01}A_{30}A^1_{23}A_{32}$, by solving the linear program in (8), one obtains $\chi=24$, $\delta_2^2=\delta_2^1=\delta_3^1=\delta_3^2=0$. Thus, the system satisfies the wafer residency time constraints. Then, according to Algorithm 10, one obtains $\chi_{12}=\chi-2\lambda-2\mu=24-2\times3-2=16$, $\omega_{01}=0$, $\omega_{30}=\alpha_3+\delta_3^2-2\lambda-3\mu-\chi=60+0-6-3-24=27$ s, $\omega^1_{23}=\chi+\alpha_2+\delta_2^1-\alpha_3-\delta_3^2-2\lambda-2\mu=24+75+0-60-0-6-2=31$ s, $\omega_{32}=\alpha_3+\delta_3^1=60+0=60$ s, and $\omega^2_{23}=\alpha_2+\delta_2^2=75+0=75$ s. By this setting, one has $\omega_{01}+\omega_{12}+\omega^2_{23}\omega_{32}+\omega^1_{23}=0+16+27+75+60+31=209$ s$=\Theta-\psi_{71}=\Theta-(12\lambda+10\mu)=255-46=209$ s.

The embodiments disclosed herein may be implemented using general purpose or specialized computing devices, computer processors, or electronic circuitries including but not limited to digital signal processors (DSP), application specific integrated circuits (ASIC), field programmable gate arrays (FPGA), and other programmable logic devices configured or programmed according to the teachings of the present disclosure. Computer instructions or software codes running in the general purpose or specialized computing devices, computer processors, or programmable logic devices can readily be prepared by practitioners skilled in the software or electronic art based on the teachings of the present disclosure.

In some embodiments, the present invention includes computer storage media having computer instructions or software codes stored therein which can be used to program computers or microprocessors to perform any of the processes of the present invention. The storage media can include, but is not limited to, floppy disks, optical discs, Blu-ray Disc, DVD, CD-ROMs, and magneto-optical disks, ROMs, RAMs, flash memory devices, or any type of media or devices suitable for storing instructions, codes, and/or data.

The present invention may be embodied in other specific forms without departing from the spirit or essential characteristics thereof The present embodiment is therefore to be considered in all respects as illustrative and not restrictive. The scope of the invention is indicated by the appended claims rather than by the foregoing description, and all changes that come within the meaning and range of equivalency of the claims are therefore intended to be embraced therein.

What is claimed is:

1. A computer implemented method for scheduling a single-arm cluster tool with wafer revisiting process and residency time constraints, comprising:

obtaining, by a processor, a wafer processing time, a wafer residency time, a robot task time for loading/unloading a wafer, and a robot task time for robot's moving;

determining, by a processor, a cycle time for the wafer revisiting process based on the wafer processing time, the robot task time for loading/unloading the wafer, and the robot task time for robot's moving;

determining, by a processor, a cycle time of system based on the wafer processing time, the robot task time for loading/unloading the wafer, and the robot task time for robot's moving;

determining, by a processor, a case of an algorithm from a plurality of defined cases of algorithms based on the wafer processing time, the determined cycle time for the wafer revisiting process, and the determined cycle time of system;

determining, by a processor, a robot scheduling strategy based on the determined case of the algorithm, wherein the robot scheduling strategy comprises a plurality of basic activity sequences;

determining, by a processor, a robot waiting time based on the wafer residency time and the determined case of the algorithm; and generating, by a processor, a schedule based on the determined robot scheduling strategy and the determined robot waiting time.

2. The method of claim 1, wherein the wafer revisiting process comprises $(PM_2, PM_3)^2$;

$PM_2$ denotes a process module for step 2;
$PM_3$ denotes a process module for step 3.

3. The method of claim 1, wherein the cycle time for the revisiting process $\zeta$ is calculated by:

$$\zeta=8\lambda+5\mu+\alpha_2+\alpha_3+\text{Max}\{\alpha_2,\alpha_3\};$$

$\lambda$ denotes the robot task time for loading/unloading the wafer;
$\mu$ denotes the robot task time for robot's moving;
$\alpha_2$ denotes a wafer processing time at step 2; and
$\alpha_3$ denotes a wafer processing time at step 3.

4. The method of claim 1, wherein the cycle time of system $\Theta$ is calculated by:

$$\Theta=\alpha_1+4\lambda+3\mu;$$

$\alpha_1$ denotes a wafer processing time at step 1;
$\lambda$ denotes the robot task time for loading/unloading the wafer; and
$\mu$ denotes the robot task time for robot's moving.

5. The method of claim 1, wherein the case of the algorithm is determined by:

$$\text{if }\Theta=\zeta\text{ with }\alpha_1+\alpha_2+2\lambda+\mu\leq\alpha_3;$$

$\Theta$ denotes the cycle time of system;
$\zeta$ denotes the cycle time for the revisiting process;
$\alpha_1$ denotes a wafer processing time at step 1;
$\alpha_2$ denotes a wafer processing time at step 2;
$\lambda$ denotes the robot task time for loading/unloading the wafer;
$\mu$ denotes the robot task time for robot's moving; and
$\alpha_3$ denotes a wafer processing time at step 3.

6. The method of claim 1, wherein the case of the algorithm is determined by:

$$\text{if }\Theta=\zeta\text{ with }\alpha_2\leq\alpha_3.$$

$\Theta$ denotes the cycle time of system;
$\zeta$ denotes the cycle time for the revisiting process;
$\alpha_2$ denotes a wafer processing time at step 2; and
$\alpha_3$ denotes a wafer processing time at step 3.

7. The method of claim 1, wherein the robot scheduling strategy comprises (1): unloading a wafer from $PM_2(\lambda)\rightarrow$moving to $PM_3(\mu)\rightarrow$loading a wafer into $PM_3(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$unloading a wafer from $PM_1(\lambda)\rightarrow$moving to $PM_2(\mu)\rightarrow$loading a wafer into $PM_2(\lambda)\rightarrow$moving to $PM_3(\mu)\rightarrow$unloading a wafer from $PM_3(\lambda)\rightarrow$moving to $PM_0(\mu)\rightarrow$loading a wafer into $PM_0(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

8. The method of claim 1, wherein the robot scheduling strategy comprises (2): unloading a wafer from $PM_2(\lambda)\rightarrow$moving to $PM_3(\mu)\rightarrow$loading a wafer into $PM_3(\lambda)\rightarrow$moving to $PM_1(\mu)\rightarrow$unloading a wafer from $PM_1(\lambda)\rightarrow$moving to $PM_2(\mu)\rightarrow$loading a wafer into $PM_2(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$moving to $PM_3(\mu)\rightarrow$unloading a wafer from $PM_3(\lambda)\rightarrow$moving to $PM_0(\mu)\rightarrow$loading a wafer into $PM_0(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

9. The method of claim 1, wherein the robot scheduling strategy comprises (3): unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_0(\mu)\rightarrow$loading a wafer into $PM_0(\lambda)\rightarrow$moving to $PM_1(\mu)\rightarrow$unloading a wafer from $PM_1(\lambda)\rightarrow$moving to $PM_2(\mu)\rightarrow$loading a wafer into $PM_2(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

10. The method of claim 1, wherein one of the robot waiting time $\omega_{01}$ is calculated by:

$$\omega_{01}=\zeta+\mu-(\alpha_3+6\lambda+5\mu+\alpha_1+\delta_1);$$

$\zeta$ denotes the cycle time for the revisiting process;
$\mu$ denotes the robot task time for robot's moving;
$\alpha_3$ denotes a wafer processing time at step 3;
$\lambda$ denotes the robot task time for loading/unloading the wafer;
$\mu$ denotes the robot task time for robot's moving;
$\alpha_1$ denotes a wafer processing time at step 1; and
$\delta_1$ denotes a wafer residency time at step 1.

11. A non-transitory computer-readable medium whose contents cause a computing system to perform a computer implemented method for scheduling a single-arm cluster tool with wafer revisiting process and residency time constraints, the method comprising:

obtaining, by a processor, a wafer processing time, a wafer residency time, a robot task time for loading/unloading a wafer, and a robot task time for robot's moving;

determining, by a processor, a cycle time for the wafer revisiting process based on the wafer processing time, the robot task time for loading/unloading the wafer, and the robot task time for robot's moving;

determining, by a processor, a cycle time of system based on the wafer processing time, the robot task time for loading/unloading the wafer, and the robot task time for robot's moving;

determining, by a processor, a case of an algorithm from a plurality of defined cases of algorithms based on the wafer processing time, the determined cycle time for the wafer revisiting process, and the determined cycle time of system;

determining, by a processor, a robot scheduling strategy based on the determined case of the algorithm, wherein the robot scheduling strategy comprises a plurality of basic activity sequences;

determining, by a processor, a robot waiting time based on the wafer residency time and the determined case of the algorithm; and generating, by a processor, a schedule based on the determined robot scheduling strategy and the determined robot waiting time.

12. The non-transitory computer-readable medium of claim 11, wherein the wafer revisiting process comprises $(PM_2, PM_3)^2$;

$PM_2$ denotes a process module for step 2;
$PM_3$ denotes a process module for step 3.

13. The non-transitory computer-readable medium of claim 11, wherein the cycle time for the revisiting process $\zeta$ is calculated by:

$$\zeta=8\lambda+5\mu+\alpha_2+\alpha_3+\text{Max}\{\alpha_2,\alpha_3\};$$

$\lambda$ denotes the robot task time for loading/unloading the wafer;
$\mu$ denotes the robot task time for robot's moving;
$\alpha_2$ denotes a wafer processing time at step 2; and
$\alpha_3$ denotes a wafer processing time at step 3.

14. The non-transitory computer-readable medium of claim 11, wherein the cycle time of system $\Theta$ is calculated by:

$$\Theta=\alpha_1+4\lambda+3\mu;$$

$\alpha_1$ denotes a wafer processing time at step 1;
$\lambda$ denotes the robot task time for loading/unloading the wafer; and
$\mu$ denotes the robot task time for robot's moving.

15. The non-transitory computer-readable medium of claim 11, wherein the case of the algorithm is determined by:

if $\Theta=\zeta$ with $\alpha_1+\alpha_2+2\lambda+\mu\leq\alpha_3$;

$\Theta$ denotes the cycle time of system;
$\zeta$ denotes the cycle time for the revisiting process;
$\alpha_1$ denotes a wafer processing time at step 1;
$\alpha_2$ denotes a wafer processing time at step 2;
$\lambda$ denotes the robot task time for loading/unloading the wafer;
$\mu$ denotes the robot task time for robot's moving; and
$\alpha_3$ denotes a wafer processing time at step 3.

16. The non-transitory computer-readable medium of claim 11, wherein the case of the algorithm is determined by:

if $\Theta=\zeta$ with $\alpha_2 \leq \alpha_3$.

$\Theta$ denotes the cycle time of system;
$\zeta$ denotes the cycle time for the revisiting process;
$\alpha_2$ denotes a wafer processing time at step 2; and
$\alpha_3$ denotes a wafer processing time at step 3.

17. The non-transitory computer-readable medium of claim 11, wherein the robot scheduling strategy comprises (1): unloading a wafer from $PM_2(\lambda)\rightarrow$moving to $PM_3(\mu)\rightarrow$loading a wafer into $PM_3(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$unloading a wafer from $PM_1(\lambda)\rightarrow$moving to $PM_2(\mu)\rightarrow$loading a wafer into $PM_2(\lambda)\rightarrow$moving to $PM_3(\mu)\rightarrow$unloading a wafer from $PM_3(\lambda)\rightarrow$moving to $PM_0(\mu)\rightarrow$loading a wafer into $PM_0(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

18. The non-transitory computer-readable medium of claim 11, wherein the robot scheduling strategy comprises (2): unloading a wafer from $PM_2(\lambda)\rightarrow$moving to $PM_3(\mu)\rightarrow$loading a wafer into $PM_3(\lambda)\rightarrow$moving to $PM_1(\mu)\rightarrow$unloading a wafer from $PM_1(\lambda)\rightarrow$moving to $PM_2(\mu)\rightarrow$loading a wafer into $PM_2(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$moving to $PM_3(\mu)\rightarrow$unloading a wafer from $PM_3(\lambda)\rightarrow$moving to $PM_0(\mu)\rightarrow$loading a wafer into $PM_0(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

19. The non-transitory computer-readable medium of claim 11, wherein the robot scheduling strategy comprises (3): unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_0(\mu)\rightarrow$loading a wafer into $PM_0(\lambda)\rightarrow$moving to $PM_1(\mu)\rightarrow$unloading a wafer from $PM_1(\lambda)\rightarrow$moving to $PM_2(\mu)\rightarrow$loading a wafer into $PM_2(\lambda)\rightarrow$moving to $PM_0(\mu)\rightarrow$unloading a wafer from $PM_0(\lambda)\rightarrow$moving to $PM_1(\mu)\rightarrow$loading a wafer into $PM_1(\lambda)\rightarrow$moving to $PM_2(\mu)\rightarrow$unloading a wafer from $PM_2(\lambda)\rightarrow$moving to $PM_3(\mu)\rightarrow$loading a wafer into $PM_3(\lambda)\rightarrow$unloading a wafer from $PM_3(\lambda)\rightarrow$moving to $PM_2(\mu)\rightarrow$loading a wafer into $PM_2(\lambda)$;

$PM_0$ denotes a process module for step 0;
$PM_1$ denotes a process module for step 1;
$PM_2$ denotes a process module for step 2;
$PM_3$ denotes a process module for step 3;
$\lambda$ denotes the robot task time for loading/unloading the wafer; and
$\mu$ denotes the robot task time for robot's moving.

20. The non-transitory computer-readable medium of claim 11, wherein one of the robot waiting time $\omega_{01}$ is calculated by:

$$\omega_{01}=\zeta+\mu-(\alpha_3+6\lambda+5\mu+\alpha_1+\delta_1);$$

$\zeta$ denotes the cycle time for the revisiting process;
$\mu$ denotes the robot task time for robot's moving;
$\alpha_3$ denotes a wafer processing time at step 3;
2, denotes the robot task time for loading/unloading the wafer;
$\lambda$ denotes the robot task time for robot's moving;
$\alpha_1$ denotes a wafer processing time at step 1; and
$\delta_1$ denotes a wafer residency time at step 1.

* * * * *